(12) United States Patent
Kadowaki

(10) Patent No.: US 9,209,797 B2
(45) Date of Patent: Dec. 8, 2015

(54) SEMICONDUCTOR DEVICE

(75) Inventor: Takuya Kadowaki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 1239 days.

(21) Appl. No.: 12/698,479

(22) Filed: Feb. 2, 2010

(65) Prior Publication Data
US 2010/0194453 A1 Aug. 5, 2010

(30) Foreign Application Priority Data

Feb. 4, 2009 (JP) .................................. 2009-023907

(51) Int. Cl.
*H03L 7/00* (2006.01)
*H03K 17/22* (2006.01)

(52) U.S. Cl.
CPC .................................. *H03K 17/223* (2013.01)

(58) Field of Classification Search
USPC .......................................... 327/143
See application file for complete search history.

(56) References Cited

U.S. PATENT DOCUMENTS

| 5,606,292 A * | 2/1997 | Oh .................................. 331/57 |
| 6,043,684 A * | 3/2000 | Landry .............................. 326/98 |
| 2002/0140460 A1* | 10/2002 | Kawakami et al. ........... 326/121 |

FOREIGN PATENT DOCUMENTS

| JP | 05-119871 | 5/1993 |
| JP | 10209851 | 8/1998 |
| JP | 2001060858 A | 3/2001 |
| JP | 2002204152 A | 7/2002 |
| JP | 2005286675 A | 10/2005 |
| JP | 2005-347862 | 12/2005 |
| JP | 2008131227 A | 6/2008 |

\* cited by examiner

*Primary Examiner* — Daniel Puentes

(57) ABSTRACT

A device includes a voltage converter circuit that includes an output node, a voltage drop circuit, and a first transistor. The first transistor is electrically coupled between the output node and the voltage drop circuit.

18 Claims, 14 Drawing Sheets

SEMICONDUCTOR DEVICE

BACKGROUND OF THE INVENTION

1. Field of the Invention

The present invention generally relates to a semiconductor device. More specifically, the present invention relates to a semiconductor device having a power-on reset circuit.

Priority is claimed on Japanese Patent Application No. 2009-023907, filed Feb. 4, 2009, the content of which is incorporated herein by reference.

2. Description of the Related Art

Japanese Unexamined Patent Application, First Publication, No. JP-A-5-119871 discloses a semiconductor device which has a power voltage level detection circuit (or a power-on reset circuit). The power voltage level detection circuit resets a predetermined circuit block in the semiconductor device when the power voltage level varies or fluctuates, for example, when power on and power off. The power-on reset circuit monitors variation or fluctuation in the power voltage level and activates a power-on reset signal to initialize (reset) a predetermined circuit block until the power voltage level is increased up to a power-on determination voltage after a predetermined time is elapsed from the startup of the power voltage level when the power voltage starts to be supplied.

Additionally, the power-on reset circuit activates the power-on reset signal again when the power voltage level supplied to such a predetermined circuit block is reduced under the power-on determination voltage even after the power voltage level is stabilized, i.e., when the power voltage is suddenly discontinued to be supplied.

Japanese Unexamined Patent Application, First Publication, No. JP-A-2005-347862 discloses a voltage converter circuit which converts the amplitude of a predetermined internal signal of the semiconductor device unlike the power-on reset circuit.

SUMMARY

In one embodiment, a device may include, but is not limited to, first and second power lines; a first node; a resistor electrically coupled to the first power line at one end thereof; a first transistor electrically coupled between the first node and the other end of the resistor; and a second transistor electrically coupled between the first node and the second power line.

In another embodiment, a device may include, but is not limited to, first and second power lines, each supplied respectively with first and second power supply potentials; a resistive element electrically coupled to the first power line at one end thereof; and a first circuit electrically coupled between the other end of the resistive element and the second power line. The first circuit receives a first signal at an input terminal thereof. The first signal has a first amplitude defined by the second power supply potential and a third power supply potential between the first power supply potential and the second power supply potential. The first circuit outputs a second signal in response to the first signal from a output terminal thereof. The second signal has a second amplitude defined by the first power supply potential and the second power supply potential.

In still another embodiment, the device may include, but is not limited to, first, second and third power lines supplied respectively with first, second and third power supply potentials. The first power supply potential is higher than the second and third power supply potentials. The third power supply potential is higher than the second power supply potential. The device may include, but is not limited to, a first circuit block operating on a voltage between the second and third power supply potentials and generating a first signal. The device may include, but is not limited to, a second circuit block which operates on a voltage between the first and second power supply potentials and receiving the first signal from the first circuit block. The device may include, but is not limited to, a first reset circuit which operates on the voltage between second and third power supply potentials and generates a first reset signal. The device may include, but is not limited to, a voltage converter which may include, but is not limited to, a first node, a resistor electrically coupled to the first power line at one end thereof, a first transistor electrically coupled between the first node and the other end of the resistor, and a second transistor electrically coupled between the first node and the second power line. The voltage converter generates a second reset signal in response to the first reset signal so as to initialize the first and second circuit blocks.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 13, 14, 15 and 16, in order to facilitate the understanding of the present invention.

Recently, in order to reduce power consumption by a semiconductor device, there has been the requirement for reducing an external power voltage level supplied to the semiconductor device. The semiconductor device includes an element which needs a high voltage for its operation. A semiconductor memory device such as a DRAM (Dynamic Random Access Memory) requires a boosted voltage VPP as a voltage supplied to a control terminal of a transistor for selecting memory cells, for example, a word line driving voltage in order to remove an influence of a threshold voltage of the transistor for selecting memory cells consisting of N-channel MOS transistors.

If the external power voltage level is lowered, it is difficult to generate the boosted power voltage. In this regard, a semiconductor device capable of being supplied a high power voltage as well as a low power voltage from an external device is being developed.

In the semiconductor device receiving a plurality of power voltages from an external device as described above, it is necessary to provide power voltage level detection circuits (or power-on reset circuits) corresponding to each power voltage.

Figure 13:
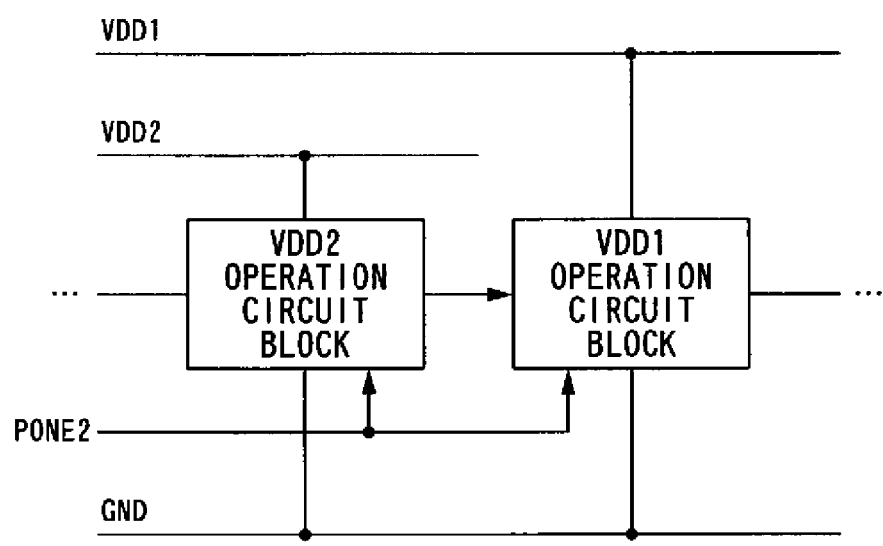
FIG. 13 is a block diagram illustrating a power-on reset circuit in accordance with the related art.

In the semiconductor device receiving a plurality of power voltages from an external device as described above, there is a part for exchanging signals between circuit blocks operated by receiving a plurality of different power voltages (VDD1 and VDD2) as shown in FIG. 13. In other words, referring to FIG. 13 a predetermined circuit block (i.e., the circuit block receiving the power voltage VDD1, hereinafter, referred to as a VDD1 operation circuit block) and a circuit block of the front stage thereof (i.e., the circuit block receiving the power voltage VDD2, hereinafter, referred to as a VDD2 operation circuit block) are operated by receiving different power voltages.

In order to normally initialize such a part (i.e., the part corresponding to the VDD1 operation circuit block in FIG. 13) in the semiconductor device, it is necessary to deactivate the power-on reset signal PONE2 after the power voltages VDD1 and VDD2 are stabilized when the power voltage starts to be supplied. Even after the voltage levels of the power voltages are stabilized, at least one of the power voltages VDD1 or VDD2 may drop under the power-on determination voltage. In this case, the power-on reset signal PONE2 should be reactivated for both the circuit blocks.

Figure 14:
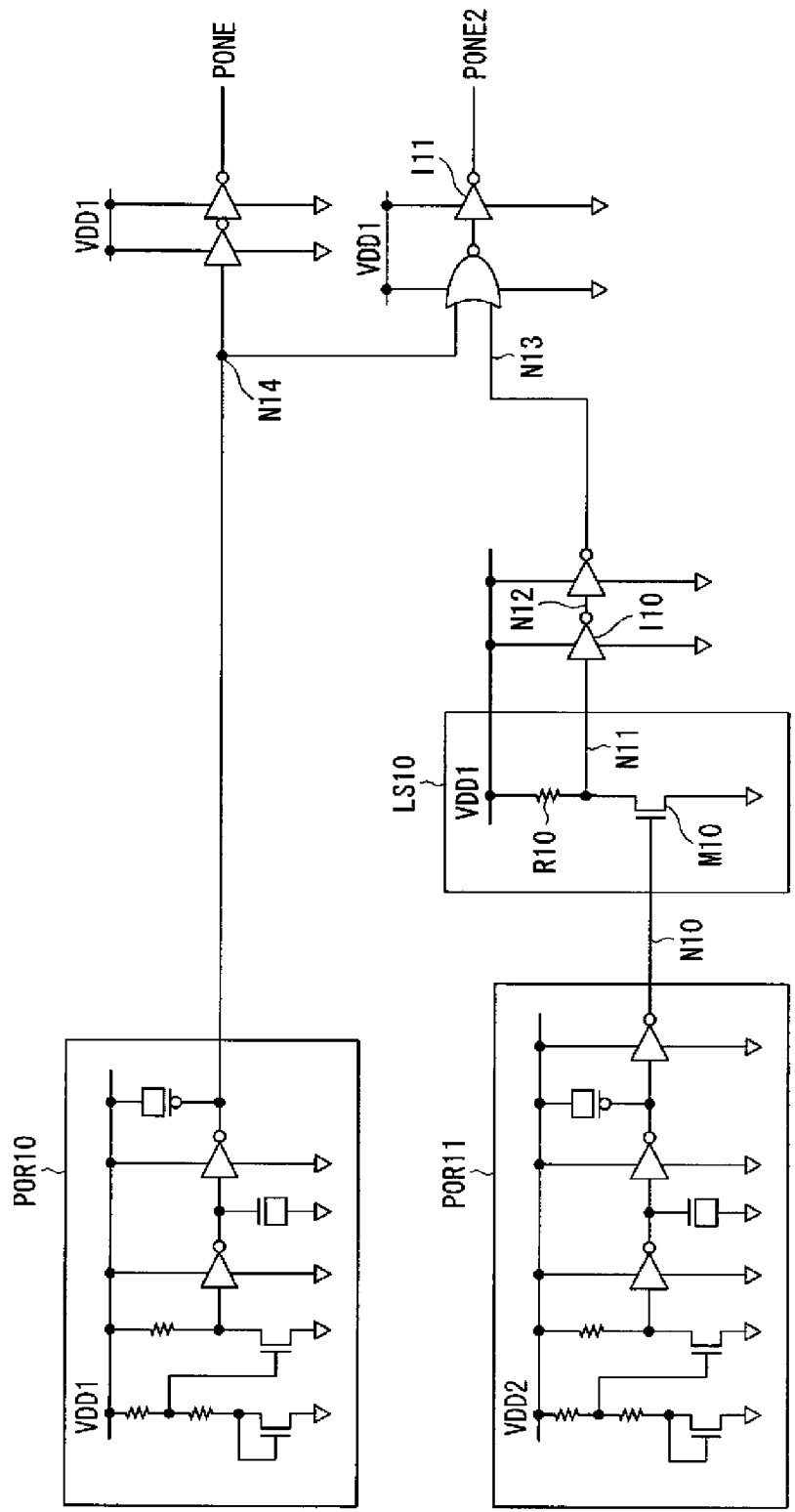
FIG. 14 is a circuit diagram illustrating a semiconductor device in accordance with the related art.

In the semiconductor device of FIG. 14, the power-on reset signal generator circuit can output the power-on reset signal by logically adding the output of the power-on reset signal POR10 for detecting variations or fluctuations in the voltage level of the power voltage VDD1 and the output signal of the power-on reset circuit POR11 for detecting variations or fluctuations in the voltage level of the power voltage VDD2.

When the power voltage VDD2 of a low voltage side starts to be supplied after the power voltage VDD1 of a high voltage side starts to be supplied and then a predetermined time is elapsed, it is necessary to set as the power voltage VDD1 the power voltage supplied to the aforementioned logical addition circuit (specifically, the inverter circuit I11 and the NOR circuit of the front stage in FIG. 14) in order to prevent the circuit block receiving the power-on reset signal PONE2 from being in a floating state.

The output signal of the power-on reset circuit POR11 for detecting variations or fluctuations in the voltage level of the power voltage VDD2 fluctuates between the power voltage VDD2 and the setup potential VSS. Since the maximum amplitude voltage of this output signal corresponds to the difference between the power voltage VDD2 and the ground voltage VSS, a level shifter is required to convert this amplitude to other amplitude corresponding to the difference between the power voltage VDD1 and the ground voltage VSS.

The level shifter LS10 shown in FIG. 14 is generally used for this purpose. JP-A-2005-347862 discloses a level shifter using a differential amplifier circuit.

It was apparent that the semiconductor device having the power-on reset circuit and the level shifter configured as described above has the following problems.

Figure 15:
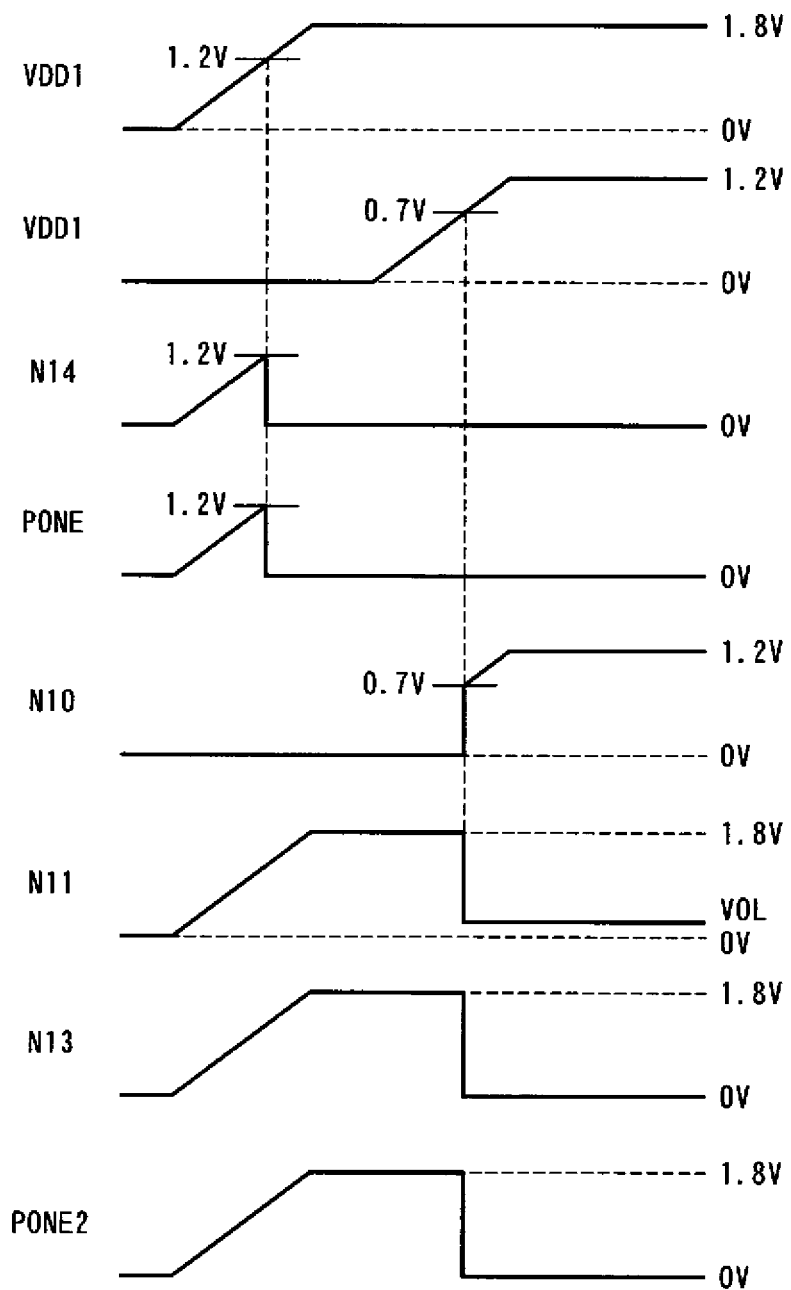
FIG. 15 is a diagram illustrating signal waveforms at the time of power-on of the semiconductor device shown in FIG. 14.

FIG. 15 is a waveform diagram for describing this fact and illustrates variations or fluctuations in the potentials of each node in the semiconductor device of FIG. 14 when the power voltage starts to be supplied. It is noted that FIG. 15 illustrates an example in which the power voltage VDD2 starts to be supplied after the power voltage VDD1 starts to be supplied. In FIG. 15, the power voltage VDD1 is set to 1.8 V, and the power voltage VDD2 is set to 1.2 V. Additionally, the power-on determination voltage of the power-on reset circuit POR10 is set to 1.2 V, and the power-on determination voltage of the power-on reset circuit POR11 is set to 0.7 V.

The level shifter LS10 includes an N-channel MOS transistor M10 and a resistor R10.

The power-on reset circuit POR10 transitions the voltage level of the output node N14 from 1.2 V to 0 V when the voltage level of the power voltage VDD1 exceeds 1.2 V which is the power-on determination voltage of the power-on reset circuit POR10. The inverter circuit connected to the node N14 and the inverter circuit of the next stage transition the power-on reset signal PONE from 1.2 V to 0 V. The power voltage VDD2 is then increased. When the power voltage VDD2 exceeds the power-on determination voltage (e.g., 0.7 V) of the power-on reset circuit POR11, the power-on reset circuit POR11 transitions the voltage level of the node N10 from 0 V to 0.7 V. The N-channel MOS transistor M10 of the level shifter LS10 is turned on, and the level shifter LS10 transitions the voltage level of the node N11 from 1.8 V to a voltage level VOL. The voltage level VOL is represented as VDD×Ron/(R10+Ron), where R10 refers to the resistance value of the resistor R10, and Ron refers to an ON resistance value of the N-channel MOS transistor M10. If this voltage level VOL is lower than the threshold voltage Vthn of the N-channel MOS transistor included in the inverter circuit I10 of the next stage, then the inverter circuit I10 sets the voltage level of the node N12 to the voltage level of the power voltage VDD1. Further, the inverter circuit of the next stage transitions the voltage level of the node N13 to 0 V.

The NOR circuit having input terminals connected to the nodes N13 and N14 and the inverter circuit I11 of the next stage transition the voltage level of the power-on reset signal PONE2 from 1.8 V to 0 V. The semiconductor device of FIG. 14 transitions the power-on reset signal PONE2 to 0 V when the voltage level of the power voltage VDD1 exceeds a reference voltage (e.g., 1.2 V) of the power-on reset circuit POR10, and the voltage level of the power voltage VDD2 exceeds a reference voltage (e.g., 0.7 V) of the power-on reset circuit POR11.

As described above, for the level shifter LS10, in order to reduce the aforementioned voltage level VOL under the threshold voltage Vthn, it is necessary to set the resistance value of the resistor R10 to be large. If the threshold voltage Vthn is set to 0.5 V, then it is necessary to set the resistance value R10 to 2.6 times or more of the ON resistance Ron of the N-channel MOS transistor M10. Since this ON resistance Ron is based on assumption that the voltage between the gate and the source is 0.7 V, it is also necessary to increase the resistance value of the resistor R10. The area occupied by the resistor in the semiconductor device is also increased. This causes the chip size to be increased.

If the resistance value of the resistor R10 is set to be large, the charging time of the node N11 is increased. When the power voltage VDD2 is suddenly discontinued to be supplied, the power-on reset signal PONE2 may not be output.

Figure 16:
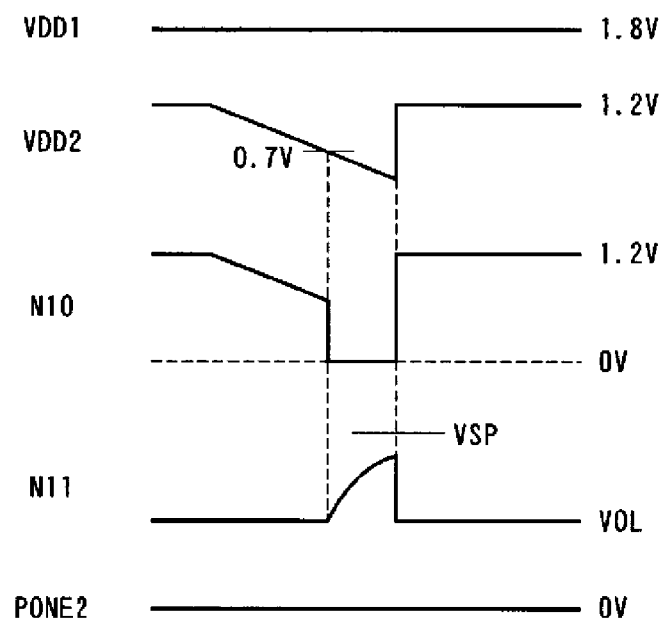
FIG. 16 is a diagram illustrating signal waveforms at the time of power-off of the semiconductor device shown in FIG. 14.

FIG. 16 is a waveform diagram for describing this fact, and illustrates operations in which the power-on reset signal PONE2 is not output when the power voltage VDD2 is suddenly discontinued to be supplied. The power-on reset circuit POR11 sets the voltage of the node N10 as an output to 0 V when the voltage level of the power voltage VDD2 is lower than the power-on determination voltage (e.g., 0.7 V) of the power-on reset circuit POR11. The N-channel MOS transistor M10 is turned off, and the level shifter LS10 charges the voltage level of the node N11 up to the voltage level of the power voltage VDD1 using the resistor R10.

If the charging of the node N11 using the resistor R10 is delayed, a time for charging the node N11 up to a voltage level equal to or higher than the switching voltage level VSP of the inverter circuit I10 of the next stage is increased. If the voltage level of the power voltage VDD2 is returned to 1.2 V before the node N11 is charged up to a voltage level equal to or higher than the switching voltage level VSP, then the N-channel MOS transistor M10 is turned on, and the level shifter LS10 discharges the node N11 up to the voltage level VOL. The power-on reset signal PONE2 will not be output when the power voltage turns on quickly within a short time.

In the conventional level shifter LS10, when the voltage level of the power voltage VDD2 is stabilized, i.e., when the power-on reset signal is deactivated, the N-channel MOS transistor M10 is turned on, and thereby, a shoot-through current flows from the power terminal to the ground terminal at all times. In order to reduce this shoot-through current, it is necessary to increase the resistance value of the resistor R10. If so, the charging time of the node N11 is further increased in turn, and this generates the aforementioned problems during the instantaneous interruption.

In the semiconductor device related to the art, if the responding capability of the level shifter LS10 to variations or fluctuations in the power voltage is improved using the resistance value of the resistor R10, current consumption is also increased. On the contrary, if the current consumption is reduced, the responding capability of the level shifter LS10 is degraded.

In this regard, the aforementioned level shifter LS10 may be substituted with a CMOS inverter circuit. In the CMOS type level shifter, when the output of the power-on reset circuit POR11, i.e., the node N10 has a high level H, a potential difference between the gate and the source of the P-channel MOS transistor included in the CMOS inverter circuit becomes equal to or higher than the absolute value Vthp of the threshold voltage, and the shoot-through current flows through the level shifter. As a result, it is impossible to reduce current consumption.

The differential amplification type level shifter described in JP-A-2005-347862 may be substituted with the aforementioned level shifter LS10. If so, a response speed responding to transition of the output voltage of the power-on reset circuit POR11 is delayed, and the charging speed of the node N11 described above is also delayed. As a result, it is difficult to output the power-on reset signal when the power voltage is suddenly discontinued to be supplied.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a device may include, but is not limited to, first and second power lines; a first node; a resistor electrically coupled to the first power line at one end thereof; a first transistor electrically coupled between the first node and the other end of the resistor; and a second transistor electrically coupled between the first node and the second power line.

The device may include, but is not limited to, a third power line; and a first circuit electrically coupled between the second power line and the third power line. The first, second and third power lines are supplied respectively with first, second and third power supply potentials. The first power supply potential is higher than the second and third power supply potentials. The third power supply potential is higher than the second power supply potential. The first circuit operates on a voltage between the third power supply potential and the second power supply potential and supplies a first signal to the first and second transistors. The first and second transistors are controlled by the first signal.

The resistor causes a voltage drop between the one and the other ends thereof. The voltage drop is substantially equal to a first value which is obtained by subtracting an absolute value of a threshold voltage of the first transistor from a voltage between the first power supply potential and the third power supply potential.

The device may include, but is not limited to, a second circuit which may include, but is not limited to, the first node, the resistor, the first transistor and the second transistor. The second circuit operates on a voltage between the first power supply potential and the second power supply potential. The second circuit generates a second signal in response to the first signal. The device may include, but is not limited to, a third circuit that operates on the voltage between the first power supply potential and the second power supply potential. The third circuit generates a third signal. The device may include, but is not limited to, a fourth circuit receiving the second signal supplied from the second circuit and the third signal from the third circuit. The fourth circuit operates on the voltage between the first power supply potential and the second power supply potential.

The fourth circuit generates a fourth signal and activates the fourth signal when at least one of the second and third signals is activated.

The second transistor is different in conductivity type from the first transistor.

The device may further include, but is not limited to, a second circuit which comprises the first node, the resistor, the first transistor and the second transistor. The second circuit operates on a voltage between the first power supply potential and the second power supply potential. The second circuit generates a second signal in response to the first signal. The first transistor may include, but is not limited to, a first electrode eclectically coupled to the second terminal of the voltage drop circuit and a control electrode electrically coupled to the first circuit, when the second signal takes an inactivate level, a voltage between the first electrode of the first transistor and the first control electrode of the first transistor is substantially equal to an absolute value of a threshold voltage of the first transistor.

The device may include, but is not limited to, a fourth power line and a second circuit electrically coupled between the second power line and the fourth power line. The fourth power line is supplied with a fourth power supply potential between the first power supply potential and the second power supply potential. The second circuit operates on a voltage between the fourth power supply potential and the second power supply potential. The second circuit generates a second signal. The device may include, but is not limited to, a third transistor coupled between the other end of the resistor and the first node in parallel with the first transistor and receiving the second signal. The device may include, but is not limited to, a fourth transistor coupled between the first node and the second power line in series with the second transistor and receiving the second signal.

In another embodiment, a device may include, but is not limited to, first and second power lines, each supplied respectively with first and second power supply potentials; a resistive element electrically coupled to the first power line at one end thereof; and a first circuit electrically coupled between the other end of the resistive element and the second power line. The first circuit receives a first signal at an input terminal thereof. The first signal has a first amplitude defined by the second power supply potential and a third power supply potential between the first power supply potential and the second power supply potential. The first circuit outputs a second signal in response to the first signal from a output terminal thereof. The second signal has a second amplitude defined by the first power supply potential and the second power supply potential.

The first circuit may include, but is not limited to, a first transistor having a first threshold voltage. The resistive element causes a voltage drop between the one and the other ends thereof. The voltage drop is substantially equal to a first value which is obtained by subtracting an absolute value of the first threshold voltage from a voltage between the first power supply potential and second power supply potential.

The first circuit may include, but is not limited to, a CMOS inverter circuit.

The first circuit may include a NAND circuit. The NAND circuit has a first input terminal receiving the first signal and a second input terminal receiving a third signal. The second signal has a third amplitude defined by the second power supply potential and the fourth power supply potential between the first power supply potential and the second power supply potential. The NAND circuit outputs the second signal in response to the first and third signals from the output terminal thereof.

In still another, the device may include, but is not limited to, first, second and third power lines supplied respectively with first, second and third power supply potentials. The first power supply potential is higher than the second and third power supply potentials. The third power supply potential is higher than the second power supply potential. The device may include, but is not limited to, a first circuit block operating on a voltage between the second and third power supply potentials and generating a first signal. The device may include, but is not limited to, a second circuit block which operates on a voltage between the first and second power supply potentials and receiving the first signal from the first circuit block. The device may include, but is not limited to, a first reset circuit which operates on the voltage between second and third power supply potentials and generates a first reset signal. The device may include, but is not limited to, a voltage converter which may include, but is not limited to, a first node, a resistor electrically coupled to the first power line at one end thereof, a first transistor electrically coupled between the first node and the other end of the resistor, and a second transistor electrically coupled between the first node and the second power line. The voltage converter generates a second reset signal in response to the first reset signal so as to initialize the first and second circuit blocks.

The resistor of the voltage converter causes a voltage drop between the one and the other ends thereof. The voltage drop is substantially equal to a first value which is obtained by subtracting an absolute value of a threshold voltage of the first transistor of the voltage converter from a voltage between the first power supply potential and the third power supply potential.

The device may include, but is not limited to, a second reset circuit operating on the voltage between the first power supply potential and the second power supply potential and generating a third reset signal. The device may include, but is not limited to, a first circuit operating on the voltage between the first power supply potential and the second power supply potential, receiving the second and third reset signals, and supplying a fourth reset signal to the first and second circuit blocks base on the second and third reset signals.

The first circuit activates the fourth reset signal when at least one of the second and third reset signals is activated.

The second transistor of the voltage converter is different in conductivity type from the first transistor of the voltage converter.

The first reset signal has a first amplitude defined by the second power supply potential and the third power supply potential. The second reset signal has a second amplitude defined by the first power supply potential and the second power supply potential.

The device may include, but is not limited to, a fourth power line supplied with a fourth power supply potential between the first and second power supply potentials. The device may include, but is not limited to, a second reset circuit operating on a voltage between the fourth power supply potential and the second power supply potential and generating a third reset signal. The voltage converter may further include, but is not limited to, a third transistor coupled between the other end of the resistor and the first node in parallel with the first transistor; and a fourth transistor coupled between the first node and the second power line in series with the second transistor. The first and second transistors receive the first reset signal at control terminals thereof. The third and fourth transistors receive the third reset signal at control terminals thereof.

The first reset circuit activates the first reset signal during a first time period in which the third power supply potential is lower than a predetermined potential between the second power supply potential and the third power supply potential, and the first and second circuit blocks are initialized in the first time period.

First Embodiment

Figure 1:
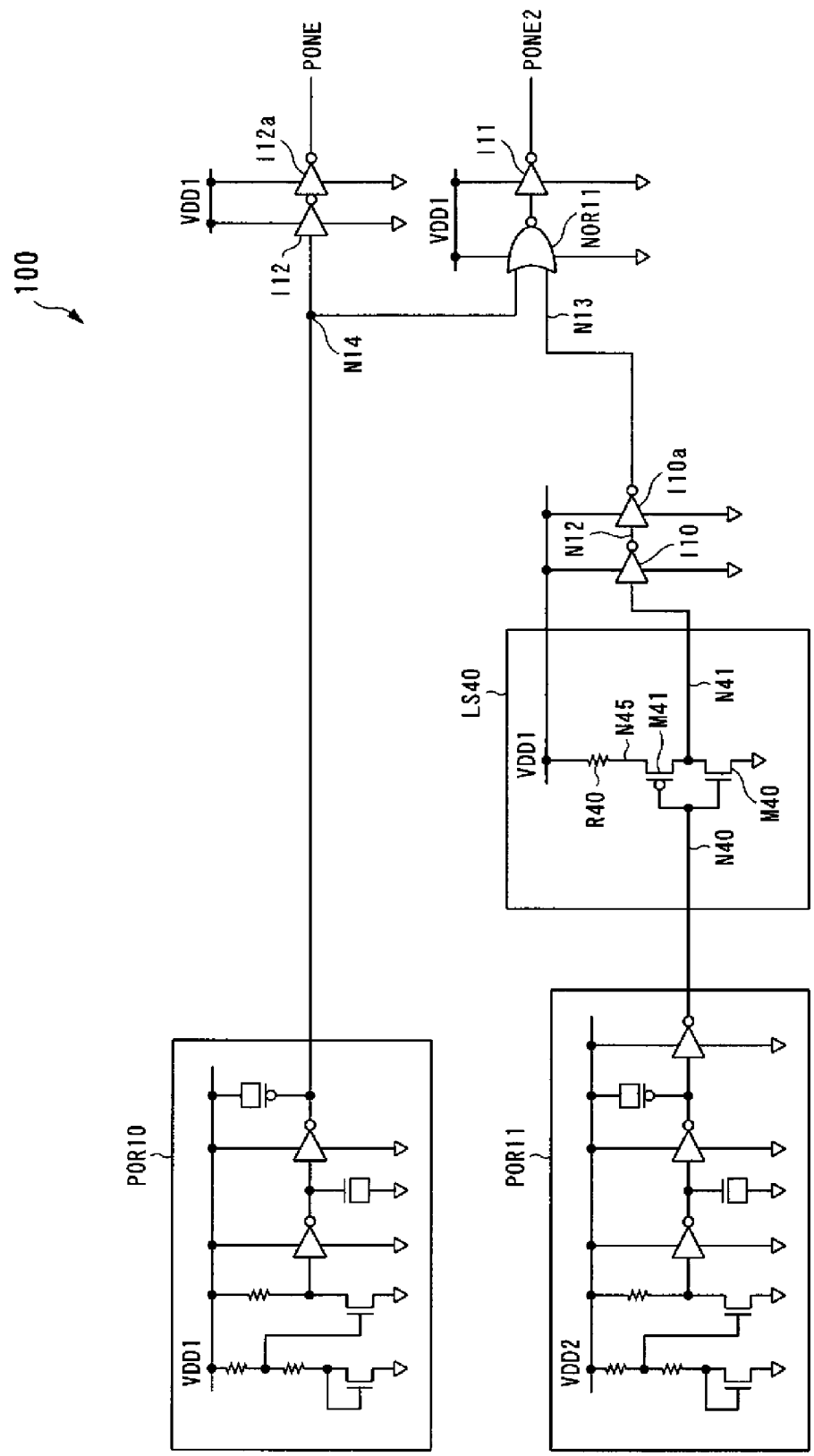
FIG. 1 is a circuit diagram illustrating a semiconductor device in accordance with a first preferred embodiment of the present invention.

A semiconductor device according to a first embodiment of the invention will be described with reference to FIG. 1. FIG. 1 is a circuit diagram illustrating a semiconductor device 100 according to the first embodiment of the invention.

The configuration of the semiconductor device 100 will now be described.

Referring to FIG. 1, the semiconductor device 100 includes power-on reset circuits POR10 and POR11, a level shifter LS40, inverter circuits I10, I10a, I11, I12, and I12a, and a NOR circuit NOR11.

The power-on reset circuit POR10 is a circuit to detect variations or fluctuations in voltage level of a power voltage VDD1 (e.g., 1.8 V), and a power-on determination voltage used to detect the variations or fluctuations is set to 1.2 V. The power voltage VDD1 is a power voltage supplied to the aforementioned VDD1 operation circuit block.

The power-on reset circuit POR11 is a circuit to detect variations or fluctuations in a voltage level of a power voltage VDD2 (e.g., 1.2 V), and the power-on determination voltage used to detect the variations or fluctuations is set to 0.7 V.

The power voltage VDD2 is a power voltage supplied to the aforementioned VDD2 operation circuit block.

The semiconductor device 100 shown in FIG. 1 transitions the voltage level of the power-on reset signals PONE and PONE2 to 1.8 V as the power voltage VDD1 starts to be supplied so as to set the VDD1 operation circuit block to an initial activation state. When the power voltage level of the power voltage VDD1 is stabilized, the voltage level of the power-on reset signal PONE is transitioned to 0 V. As the voltage level of the power-on reset signal PONE is transitioned (deactivated) to 0 V, if there is no circuit in the VDD1 operation circuit block that is operated by receiving the power voltage VDD2 in the front stage, the initialization is terminated.

Meanwhile, if the VDD2 operation circuit block exists in the front stage of the VDD1 operation circuit block, and the initialization state is terminated before the power voltage VDD2 is stabilized, then a part of the VDD1 operation circuit block operated by receiving the signal input via the VDD2 operation circuit block may not be normally initialized. Therefore, the voltage level of the power-on reset signal PONE2 is maintained at 1.8 V. Then, after the power voltage level of the power voltage VDD2 is stabilized, the voltage level of the power-on reset signal PONE2 is transitioned to 0 V. As the power-on reset signal PONE2 is transitioned (deactivated) to 0 V, the initialization is terminated for a part of the VDD1 operation circuit block connected to the VDD2 operation circuit in the front stage and the VDD2 operation circuit block.

When one of the voltage levels of the power voltages VDD1 and VDD2 is lower than a reference voltage due to instantaneous interruption of the power voltage, the voltage level of the power-on reset signal PONE2 is transitioned to 1.8 V, and the VDD1 operation circuit block is returned to the initial activation state. When the power voltage is recovered from the instantaneous interruption, the voltage level of the power-on reset signal PONE2 is transitioned to 0 V, and the initial activation state of the VDD1 operation circuit block is terminated to prepare a desired operation again.

The level shifter LS40 includes a resistor R40 connected in series between the power voltage VDD1 and the ground voltage VSS and a CMOS inverter (having a P-channel MOS transistor M41 and an N-channel MOS transistor M40).

Hereinafter, characteristics of the level shifter LS40 different from a conventional level shifter will be described in detail with reference to FIGS. 2 and 3 before the operation of the semiconductor device 100 of FIG. 1 is described.

Figure 2:
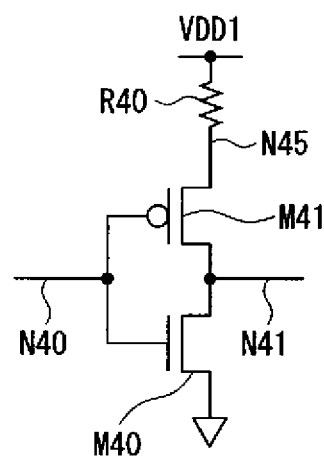
FIG. 2 is a circuit diagram illustrating a level shifter included in the semiconductor device shown in FIG. 1.

FIG. 2 is a circuit diagram particularly illustrating the level shifter LS40 of FIG. 1. FIG. 3 is a characteristic diagram illustrating input/output characteristics of the level shifter LS40.

In FIG. 2, similar reference numerals to those of FIG. 1 are denoted in each node of the level shifter.

First, a configuration of the level shifter LS40 will be described with reference to FIG. 2.

The resistor R40 has one end connected to a terminal where the power voltage VDD1 (e.g., 1.8 V) is supplied and the other end connected to a source terminal corresponding to a first or second main electrode of the P-channel MOS transistor. The gate terminal corresponding to a control electrode of the P-channel MOS transistor M41 is connected to the node N40, and the drain terminal corresponding to a first or second main electrode is connected to the drain terminal corresponding to a first or second main electrode of the N-channel MOS transistor M40. The gate terminal corresponding to a control terminal of the N-channel MOS transistor M40 is connected to the node N40, and the source terminal corresponding to a first or second main electrode is connected to the ground terminal VSS.

The output signal of the power-on reset circuit POR11 is input to the node N40, and its voltage level VN40 fluctuates between the power voltage VDD2 (e.g., 1.2 V) and the ground voltage VSS (e.g., 0 V) as the power-on reset circuit POR11 detects variations or fluctuations in the voltage level of the power voltage VDD2.

In addition, the node N41 is a common node between the P-channel MOS transistor M41 and the N-channel MOS transistor M40 and connected to an input terminal of the inverter circuit I10 of the next stage.

Figure 3:
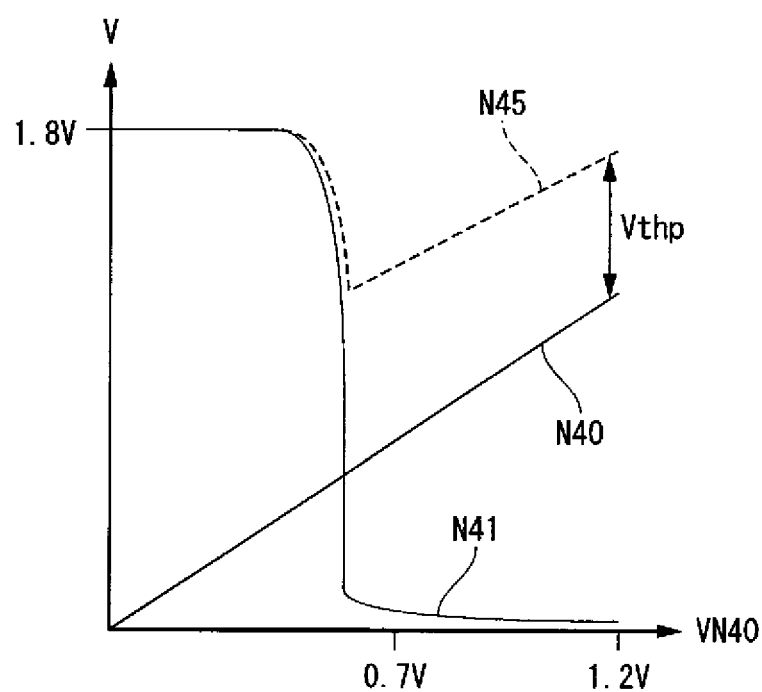
FIG. 3 is a diagram illustrating characteristics of the level shifter shown in FIG. 2.

In the characteristic diagram of FIG. 3, the abscissa represents an input voltage of the level shifter LS40, i.e., the voltage level VN40 of the node N40, and the ordinate represents a voltage level VN40 ranged from 0 V to 1.2 V, so that the voltage levels of each node (i.e., the nodes N40, N41, and N45) of the level shifter LS40 are plotted.

When the voltage level VN40 is 0 V, i.e., when the output voltage level of the power-on reset circuit POR11 is 0 V, the N-channel MOS transistor M40 is turned off, and the P-channel MOS transistor M41 is turned on. Therefore, the voltage levels of the nodes N41 and N45 are 1.8 V.

As the voltage level VN40 is increased, the voltage between the gate and the source of the P-channel MOS transistor M41 is reduced, and the voltage between the gate and the source of the N-channel MOS transistor M40 is increased. When the voltages between the gate and the source of the P-channel MOS transistor M41 and the N-channel MOS transistor M40 approach threshold voltages of each transistor, the voltage levels of the nodes N41 and N45 start to drop from 1.8 V.

As the input voltage level VN40 is further increased, the P-channel MOS transistor M41 is nearly turned off, and the N-channel MOS transistor M40 is turned on. The voltage level of the node N41 drops to a low level (e.g., the voltage level VOL). Assuming that the absolute value of the threshold voltage of the P-channel MOS transistor M41 is denoted as Vthp, the voltage level of the node N45 drops until the difference between voltage levels of the nodes N40 and N45 is equal to the threshold voltage Vthp. Since the P-channel MOS transistor M41 is nearly turned off thereafter, the voltage level of the node N40 is increased while maintaining a difference from the voltage level of the node N40 to be as much as the threshold voltage Vthp.

The reason why the voltage level of the node N45 is increased while maintaining the difference from the voltage level of the node N40 to be as much as the threshold voltage Vthp is as follows. Specifically, when the P-channel MOS transistor M41 is turned off (a non-conduction state), the potential of the node N45 approaches the power voltage VDD1. Then, the voltage between the source and the gate of the P-channel MOS transistor M41 is increased, and the P-channel MOS transistor M41 tries to be turned on (a conduction state).

When the P-channel MOS transistor M41 is turned on, the voltage of the node N45 drops again due to the voltage drop in the resistor R40. As a result, the P-channel MOS transistor M41 tries to be turn off (a non-conduction state) again.

In this manner, by iteratively switching the P-channel MOS transistor M41 between the ON state and the OFF state (herein, this state is expressed as "the P-channel MOS transistor M41 is nearly turned off"), the voltage level of the node N45 is increased while maintaining a difference from the voltage level of the node N40 to be as much as the threshold voltage Vthp.

The P-channel MOS transistor M41 is formed in an N-type well, and the N-type well is bound to the power voltage VDD1. Due to a back-bias effect, as a difference of voltage levels between the voltage level of the source terminal (i.e., the node N45) and the power voltage VDD1 is decreased, the threshold voltage Vthp is accordingly decreased.

While the difference of voltage levels between the nodes N40 and N45 is decreased as the voltage level VN40 is increased, the difference is continuously maintained to be as much as the absolute value of the threshold voltage Vthp. In addition, the voltage level between both ends of the resistor R40, i.e., the voltage drop in the resistor R40, is represented as (1.8 V−VN40−Vthp).

If the voltage level of the node N40 is 0.7 V, and the Vthp is set to 0.55 V, then the voltage drop VR40 in the resistor R40 becomes 0.55 V.

This configuration will be described by comparison with a conventional level shifter LS10. In order to operate the inverter circuit of the next stage, the output voltage of the level shifter LS10 should be increased up to the threshold voltage Vthn (e.g., 0.5 V) of the N-channel MOS transistor. Therefore, the output voltage when the input voltage is 0.7 V is set to 0.5 V.

In the level shifter LS10, the voltage level between both ends of the resistor R10, i.e., the voltage drop in the resistor R10, becomes 1.3 V.

In the design process, if the currents flowing through the level shifters LS10 and LS40 when the input voltage is 0.7 V are set to be equal to each other, the currents flowing through the resistors R10 and R40 also become equal to each other. Therefore, a value obtained by subtracting the voltage drop (e.g., 1.3 V) in the resistor R10 from the resistance value becomes equal to a value obtained by subtracting the voltage drop (e.g., 0.55 V) in the resistor R40 from the resistance value. In other words, it is possible to reduce the resistance value of the resistor R40 to approximately 35% of the resistance value of the resistor R10.

When the power voltage VDD2 (e.g., 1.2 V) is stabilized, i.e., when the output voltage level of the power-on reset circuit POR11 is 1.2 V, the voltage drop VR40 in the resistor R40 becomes 0.05 V assuming that the threshold voltage Vthp is set to 0.55 V as described above. Meanwhile, the voltage drop in the resistor R10 becomes nearly 1.8 V because the N-channel MOS transistor M10 is turned on.

The shoot-through current of the level shifter LS40 is equal to a value obtained by subtracting the voltage drop (e.g., 0.05 V) in the resistor R40 from the resistance value, and the shoot-through current of the level shifter LS10 is equal to a value obtained by subtracting the voltage drop (e.g., 1.8 V) in the resistor R10 from the resistance value.

Assuming that the resistance value of the resistor R40 is set to 35% of the resistance value of the resistor R10 as described above, the shoot-through current of the level shifter LS40 is reduced to 10% of the shoot-through current of the level shifter LS10.

While the characteristics of the level shifter LS40 are apparent from the descriptions hereinbefore, circuit operations of the semiconductor device 100 of FIG. 1 will now be described with reference to FIGS. 4 and 5.

Figure 4:
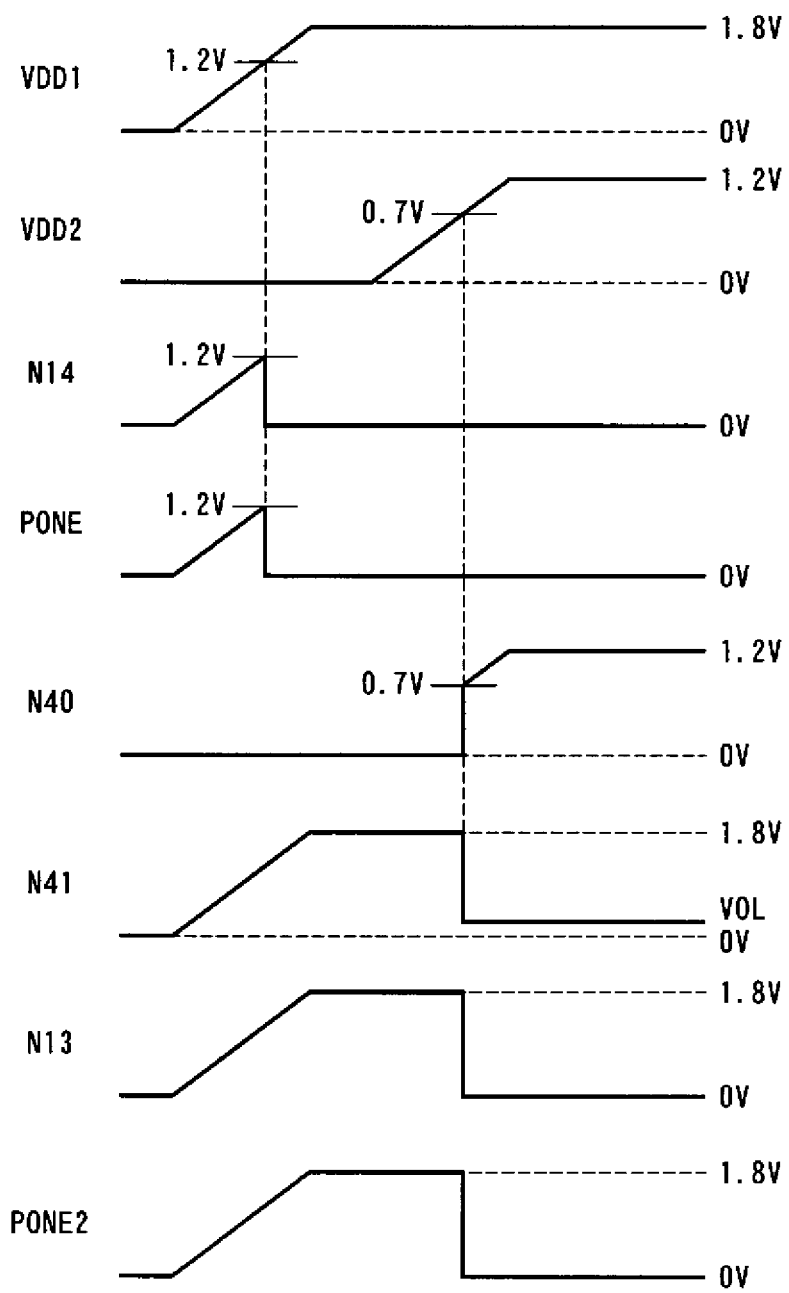
FIG. 4 is a diagram illustrating signal waveforms at the time of power-on of the semiconductor device shown in FIG. 1.
Figure 5:
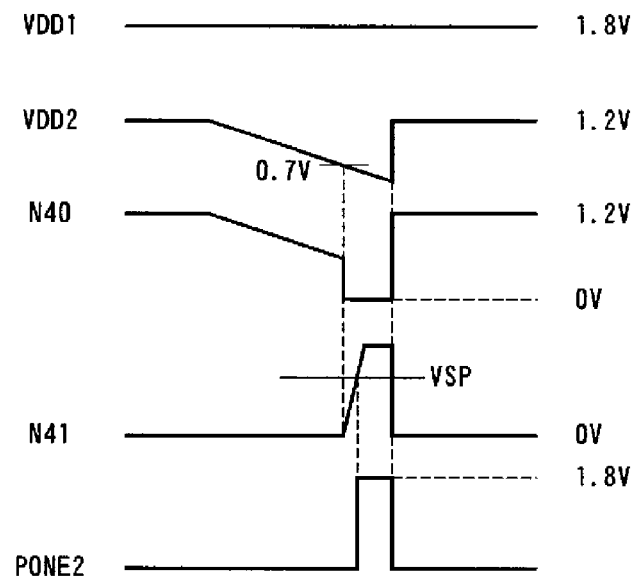
FIG. 5 is a diagram illustrating signal waveforms at the time of power-off of the semiconductor device shown in FIG. 1.

FIG. 4 illustrates a voltage change in each node of the semiconductor device 100 when a power voltage starts to be supplied. Referring to FIG. 4, the power voltage VDD1 starts to be supplied first, and then, the power voltage VDD2 starts to be supplied. When the voltage level of the power voltage VDD1 exceeds the power-on determination voltage (e.g., 1.2 V), the power-on reset circuit POR10 transitions the voltage level of the output node N14 from 1.8 V to 0 V. Accordingly, the inverter circuit I12 connected to the node N14 and the inverter circuit I12a of the next stage transition the power-on reset signal PONE from 1.8 V to 0 V. As the power-on reset signal PONE is transitioned (deactivated) to 0 V, if there is no circuit in the VDD1 operation circuit block that is operated by receiving the power voltage VDD2 in the front stage, the initialization is terminated.

When the power voltage VDD2 starts to be supplied, and the voltage level of the power voltage VDD2 exceeds the power-on determination voltage (e.g., 0.7 V), the power-on reset circuit POR11 transitions the voltage level of the node N40 from 0 V to 0.7 V. As a result, the N-channel MOS transistor M40 of the level shifter LS40 is turned on, and the level shifter LS10 transitions the voltage level of the node N41 from 1.8 V to the voltage level VOL.

Since the voltage between the gate and the source of the P-channel MOS transistor 41 is close to the threshold voltage Vthp as described above, and the ON resistance of the P-channel MOS transistor is high, the voltage level VOL is close to 0 V. The level shifter LS40 has a CMOS inverter including a P-channel MOS transistor 41 and an N-channel MOS transistor 40. The level shifter LS40 discharges the voltage level of the node N41 up to approximately 0 V at the same speed as the CMOS inverter. The inverter circuit I10 of the next stage transitions the voltage level of the node N12 to the voltage level of the power voltage VDD1, and the inverter circuit I10a of the next stage transitions the voltage level of the node N13 to 0 V.

The NOR circuit NOR11 having an input terminal connected to the nodes N13 and N14 and the inverter circuit I11 of the next stage transition the voltage level of the power-on reset signal PONE2 from 1.8 V to 0 V. As a result, the initialization is terminated for a part of the VDD1 operation circuit block connected to the VDD2 operation circuit in the front stage and the VDD2 operation circuit block.

If the voltage level of the power voltage shown in the drawing exceeds the power-on determination voltage of each power-on reset circuit when the power voltage starts to be supplied, the semiconductor device 100 of FIG. 1 sequentially transitions the power-on reset signals PONE and PONE2 to 0 V to terminate initialization of the VDD1 operation circuit block receiving these signals and prepare a desired operation.

Operations will be described for outputting the power-on reset signal PONE2 in FIG. 5 when the power voltage VDD2 is suddenly discontinued to be supplied. When the voltage level of the power voltage VDD2 is lower than the power-on determination voltage (e.g., 0.7 V) of the power-on reset circuit POR11, the power-on reset circuit POR11 sets the voltage of the node N10 corresponding to the output to 0 V. As a result, since the N-channel MOS transistor M40 is turned off, and the P-channel MOS transistor M41 is turned on, the level shifter LS40 charges the node N41 using the resistor R10 at the same speed as the CMOS inverter up to a value equal to or higher than a switching voltage level VSP of the inverter circuit I11 of the next stage.

The inverter circuit I10 of the next stage transitions the voltage level of the node N12 to 0 V, and further transitions the voltage level of the node N13 up to the level of the power voltage VDD1. As a result, the NOR circuit NOR11 and the inverter circuit I11 of the next stage transitions the voltage level of the power-on reset signal PONE2 from 0V to 1.8 V. Then, the voltage level of the power voltage VDD2 is returned to 1.2 V, and the semiconductor device 100 transitions the power-on reset signal PONE2 to 0 V as described above in conjunction with a case when the power voltage starts to be supplied. As a result, initialization is terminated for the VDD1 operation circuit block and the VDD2 operation circuit block to prepare a desired operation.

As described above, according to this embodiment of the invention, the semiconductor device (the semiconductor device 100) receives the first power voltage VDD1 and the second power voltage VDD2 which is lower than the first power voltage VDD1 and higher than the ground voltage from an external device. The semiconductor device (the semiconductor device 100) includes first and second power voltage detection circuits (the power-on reset circuits POR10 and POR11) provided for first and second power voltages, respectively. The semiconductor device (the semiconductor device 100) also includes a voltage converter circuit (the level shifter LS40) which converts the amplitude of the output signal of the second power voltage detection circuit (the power on reset circuit POR11) to the first power voltage. The voltage converter circuit includes a voltage drop element (the resistor R40) having one end connected to a first power line through which the first power voltage is supplied. The voltage converter circuit also include a first transistor (the P-channel MOS transistor M41) having a main electrode connected to the other end of the voltage drop element and a control terminal connected to the output terminal of the second power voltage detection circuit. The voltage drop (VR40) in the voltage drop element is nearly or substantially the same as a value obtained by subtracting the absolute value of the threshold voltage (Vthp) of the first transistor from the difference between the first and second power voltages.

As a result, a pull-up transistor (i.e., the P-channel MOS transistor M41) of a logic inverter circuit is connected between the output node N41 of the level shifter LS40 and the resistor R40 (a voltage-drop circuit), and its gate voltage is controlled by the input signal. Therefore, it is possible to reduce the resistance value of the resistor R40 in comparison with a conventional semiconductor device and rapidly charge the output node N41 of the level shifter LS40. Additionally, it is possible to provide a level shifter having an excellent responding capability to variations or fluctuations in the power voltage when the power voltage starts to be supplied or when the power voltage is suddenly discontinued to be supplied. Since the resistance value of the resistor R40 included in the level shifter LS40 can be reduced in comparison with a conventional level shifter, it is possible to provide a level shifter occupying a small area in a chip.

The voltage drop in the resistor (a voltage drop circuit) is nearly the same as a value obtained by subtracting an absolute value of the threshold voltage Vthp of the pull-up transistor (the P-channel MOS transistor) included in the logic inverter circuit from the difference between the first and second power voltage levels.

When the output of the power-on reset circuit POR11, i.e., the voltage between the gate and the source of the P-channel MOS transistor M41 included in the CMOS inverter circuit when the node N40 is at a high level becomes approximately the absolute value of the threshold voltage Vthp. As a result, it is possible to reduce current consumption in the level shifter LS40.

Furthermore, it is possible to obtain the following advantages.

Figure 6:
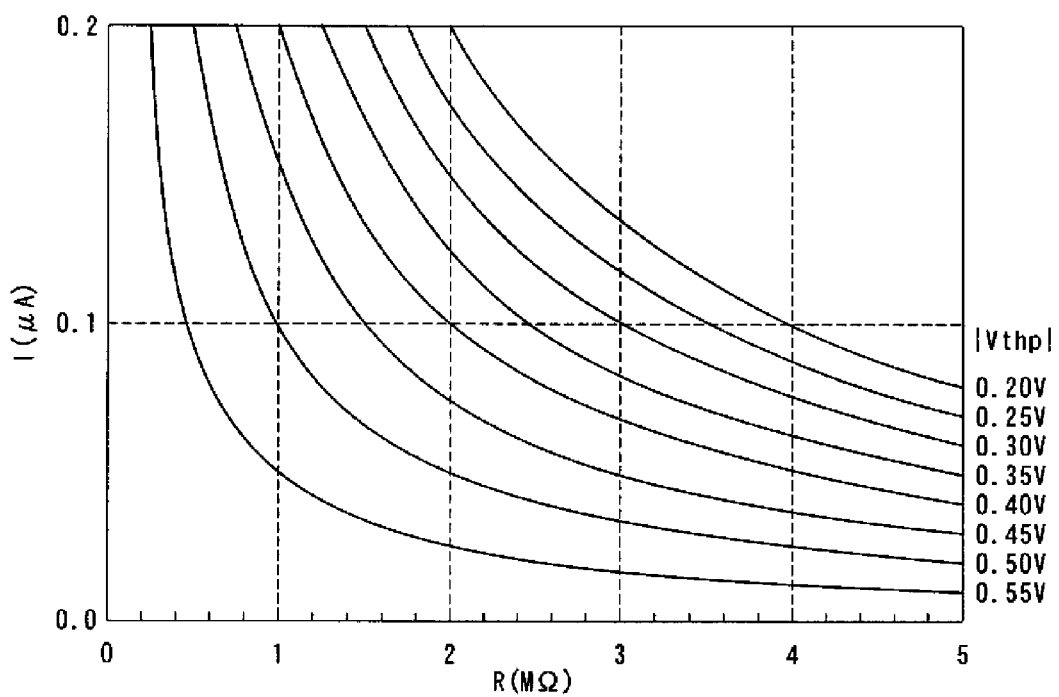
FIG. 6 is a diagram illustrating characteristics of the semiconductor device shown in FIG. 1.

FIG. 6 illustrates simulation results for the variations or fluctuations in the electric current amount flowing through the level shifter LS40 when the aforementioned resistance value of the resistor R40 and the absolute value of the threshold voltage Vthp of the PMOS transistor M41 are changed. In this simulation, the power voltage VDD1 is set to 1.8 V, and the power voltage VDD2 is set to 1.2 V.

Assuming that the resistance value of the resistor R40 is set to 2 MΩ, and the absolute value of the threshold voltage Vthp of the PMOS transistor M41 is set to 0.55 V, the current consumption in the level shifter LS40 is approximately 0.1 µA even when the absolute value of the threshold voltage Vthp is changed up to 0.4 V due to deviations in a manufacturing process.

In a DRAM (Dynamic Random Access Memory) as one of representative semiconductor devices 100, a DPD (Deep Power Down) mode may be provided as an operation mode for reducing a standby current when it is unnecessary to store data in a memory cell. In such a DRAM, during the DPD mode, it is required to suppress the current consumption in the circuit block to which the power voltage VDD1 is supplied to approximately 10 µAA. Additionally, such a DRAM includes several level shifters for converting the voltage level of the output signal of the aforementioned power-on reset circuit.

Since the current consumption in the level shifter according to this embodiment of the invention is suppressed to 0.1 µA, a percentage of the current consumption of the level shifter with respect to the entire current consumption in the aforementioned DPD mode is small. Therefore, in a DRAM capable of operating in the DPD mode, even when the resistance value of the resistor R40 or the threshold voltage Vthp varies due to deviations in a manufacturing process or the like, it is possible to reduce the current consumption in the level shifter. It is possible to reduce the current consumption in the entire DRAM.

Second Embodiment

A semiconductor device 200 according to a second embodiment of the invention will be described with reference to FIG. 7.

Figure 7:
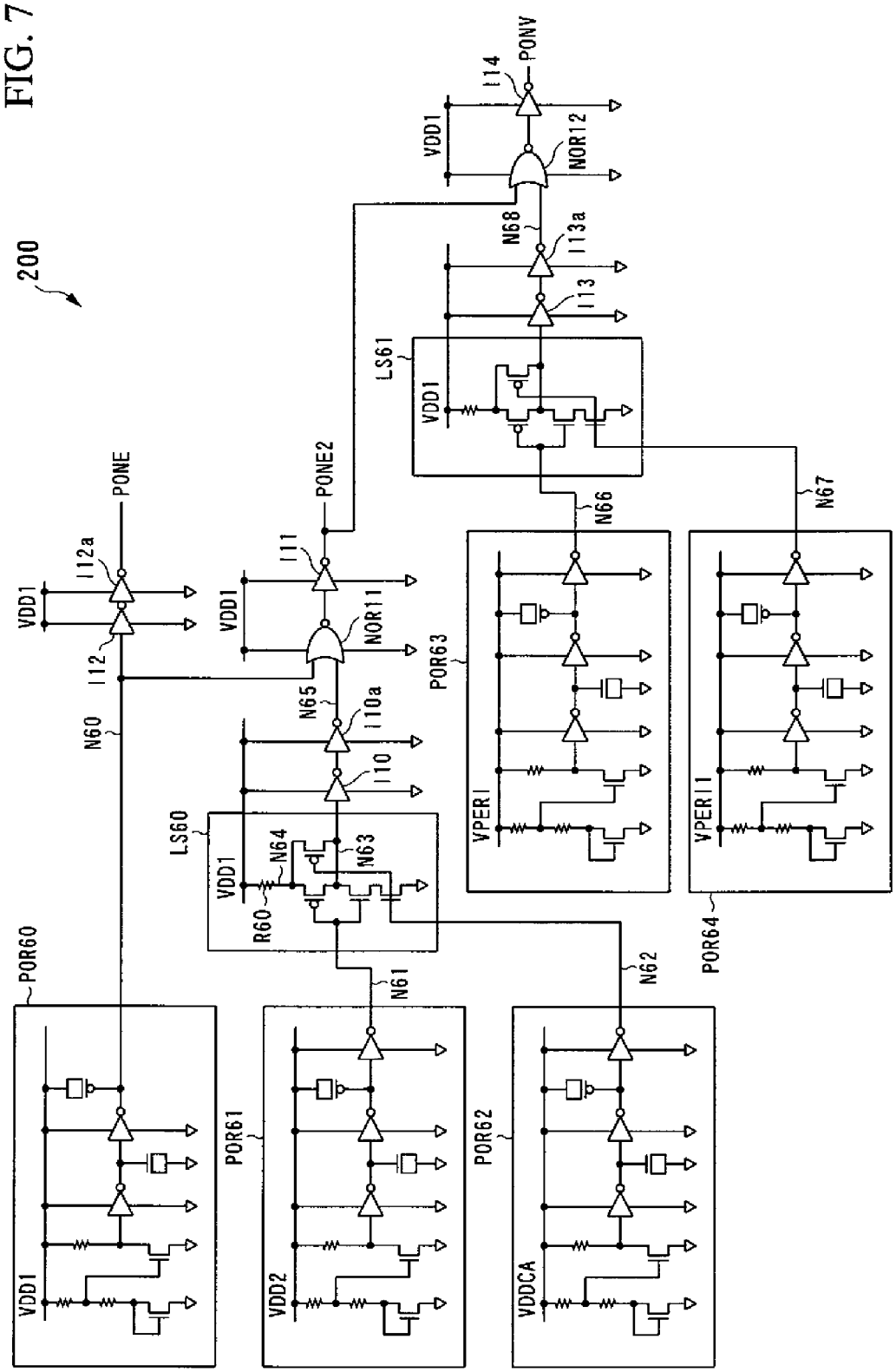
FIG. 7 is a circuit diagram illustrating a semiconductor device in accordance with a second preferred embodiment of the present invention.

Referring to FIG. 7, the power voltage supplied to the semiconductor device 200 is increased in comparison with the aforementioned semiconductor device 100 according to the first embodiment. Power voltages VDDCA, VPERI, and VPERI1 are added, and accordingly, power-on reset circuits are added.

Although not shown in FIG. 7, the semiconductor device 200 further includes circuit blocks (i.e., a VDDCA operation circuit block, a VPERI operation circuit block, and a VPERI1 operation circuit block) operated by receiving the corresponding power voltages.

The power-on reset circuit POR62 is a circuit to detect variations or fluctuations in the voltage level of the power voltage VDDCA (e.g., 1.2 V), and the power-on determination voltage used in the detection is set to 0.7 V.

The power voltage VDDCA is a power voltage supplied to, for example, an input buffer circuit block (hereinafter, referred to as a VDDCA operation circuit block).

The power-on reset circuit POR63 is a circuit to detect variations or fluctuations in the voltage level of the power voltage VPERI (e.g., 1.2 V), and the power-on determination voltage used in the detection is set to 0.7 V.

In case of DRAMs, the power voltage VPERI is a power voltage supplied to a peripheral circuit block (hereinafter, referred to as a VPERI operation circuit block) when a memory cell is operated. The power voltage VPERI is also an output voltage of a power voltage drop circuit included in the DRAM.

The power-on reset circuit POR64 is a circuit to detect variations or fluctuations in the voltage level of the power voltage VPERI1 (e.g., 1.8 V), and the power-on determination voltage used in the detection is set to 1.2 V.

In case of DRAMs, the power voltage VPERI is a power voltage supplied from an external device to the aforementioned power voltage drop circuit (hereinafter, referred to as a VPERI1 operation circuit block).

The power-on reset circuit POR60 and the power-on reset circuit POR61 in FIG. 7 correspond to the power-on reset circuits POR10 and POR11 of the aforementioned semiconductor device 100 for detecting the voltage levels of the power voltages VDD1 and VDD2 (e.g., 1.8 V and 1.2 V, respectively).

As the power voltage VDD1 starts to be supplied, the semiconductor device 200 transitions the voltage levels of the power-on reset signals PONE, PONE2, and PONV to 1.8 V to make the aforementioned VDD1 operation circuit block enter an initial activation state. When the power voltage level of the power voltage VDD1 is stabilized, the voltage level of the power-on reset signal PONE is transitioned to 0 V. As the power-on reset signal PONE is transitioned (deactivated) to 0 V, if there is no circuit in the VDD1 operation circuit block that is operated by receiving the power voltage VDD2, VDDCA, VPERI, or VPERI1 in the front stage, the initialization is terminated.

If the VDD2 operation circuit block and the VDDCA operation circuit block exist in the front stage of the VDD1 operation circuit block, and the initialization state is terminated before the power voltages VDD2 and VDDCA are stabilized, then a part of the VDD1 operation circuit block operated by receiving the signal input via the VDD2 operation circuit block and the VDDCA operation circuit block may not be normally initialized. Therefore, the voltage level of the power-on reset signal PONE2 is maintained in 1.8 V.

Then, after the power voltage levels of the power voltages VDD2 and VDDCA are stabilized, the voltage level of the power-on reset signal PONE2 is transitioned to 0 V. As the power-on reset signal PONE2 is transitioned (deactivated) to 0 V, if there is no circuit in the VDD1 operation circuit block, the VDD2 operation circuit block, and the VDDCA operation circuit block operated by receiving the power voltage VPERI or VPERI1, the initialization is terminated.

If the VPERI operation circuit block and the VPERI1 operation circuit block exist in the front stage of the VDD1 operation circuit block, the VDD2 operation circuit block, and the VDDCA operation circuit block, and the initialization of the VDD1 operation circuit block is terminated before the power voltages VPERI and VPERI1 are stabilized, then a part of the aforementioned circuit blocks operated by receiving the signal input via the VPERI operation circuit block and the VPERI1 operation circuit block may not be normally initialized. Therefore, the initialization state is maintained by keeping the voltage level of the power-on reset signal PONV at 1.8 V.

After the voltage levels of the power voltages VPERI and VPERI1 are stabilized, the voltage level of the power-on reset signal PONV is transitioned to 0 V. As the power-on reset signal PONV is transitioned (deactivated) to 0 V, the initialization is terminated for a part of the VDD1 operation circuit block, the VDD2 operation circuit block, and the VDDCA operation circuit block connected to the VPERI operation circuit block and the VPERI1 operation circuit block in the front stage, the VPERI operation circuit block, and the VPERI1 operation circuit block.

If one of the five power voltages is lower than the reference voltage due to instantaneous interruption of the power voltage, the voltage level of the power-on reset signal PONE2 is transitioned to 1.8 V, and the VDD1 operation circuit block is returned to the initialization state. Then, when the power voltage is recovered from the instantaneous interruption, the voltage level of the power-on reset signal PONE2 is transitioned to 0 V, and the initialization for the VDD1 operation circuit block is terminated to prepare a desired operation.

The semiconductor device 200 includes level shifters LS60 and LS61.

The level shifter LS60 includes a NAND circuit (or a negative AND circuit) and a resistor R60 connected in series between the power voltage VDD1 and the ground voltage VSS. The NAND circuit receives the output signals of the power-on reset circuits POR61 and POR62 via the nodes N61 and N62 and drives the inverter circuit I10 of the next stage.

The level shifter LS61 includes a NAND circuit (or a negative AND circuit) and a resistor R61 connected in series between the power voltage VDD1 and the ground voltage VSS. The NAND circuit receives the output signals of the power-on reset circuits POR63 and POR64 via the nodes N66 and N67 and drives the inverter circuit I13 of the next stage.

Characteristics of the level shifter of the semiconductor device 200 different from a conventional level shifter will be described in detail with reference to FIGS. 8, 9, and 17 before an operation of the semiconductor device 200 of FIG. 7 is described.

Figure 8:
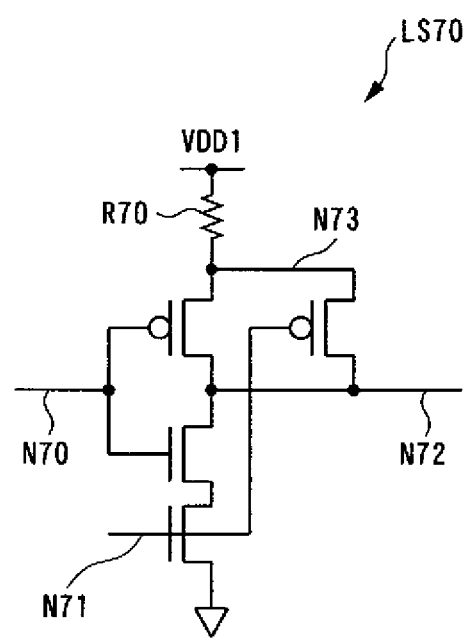
FIG. 8 is a circuit diagram illustrating a level shifter included in the semiconductor device shown in FIG. 7.
Figure 9:
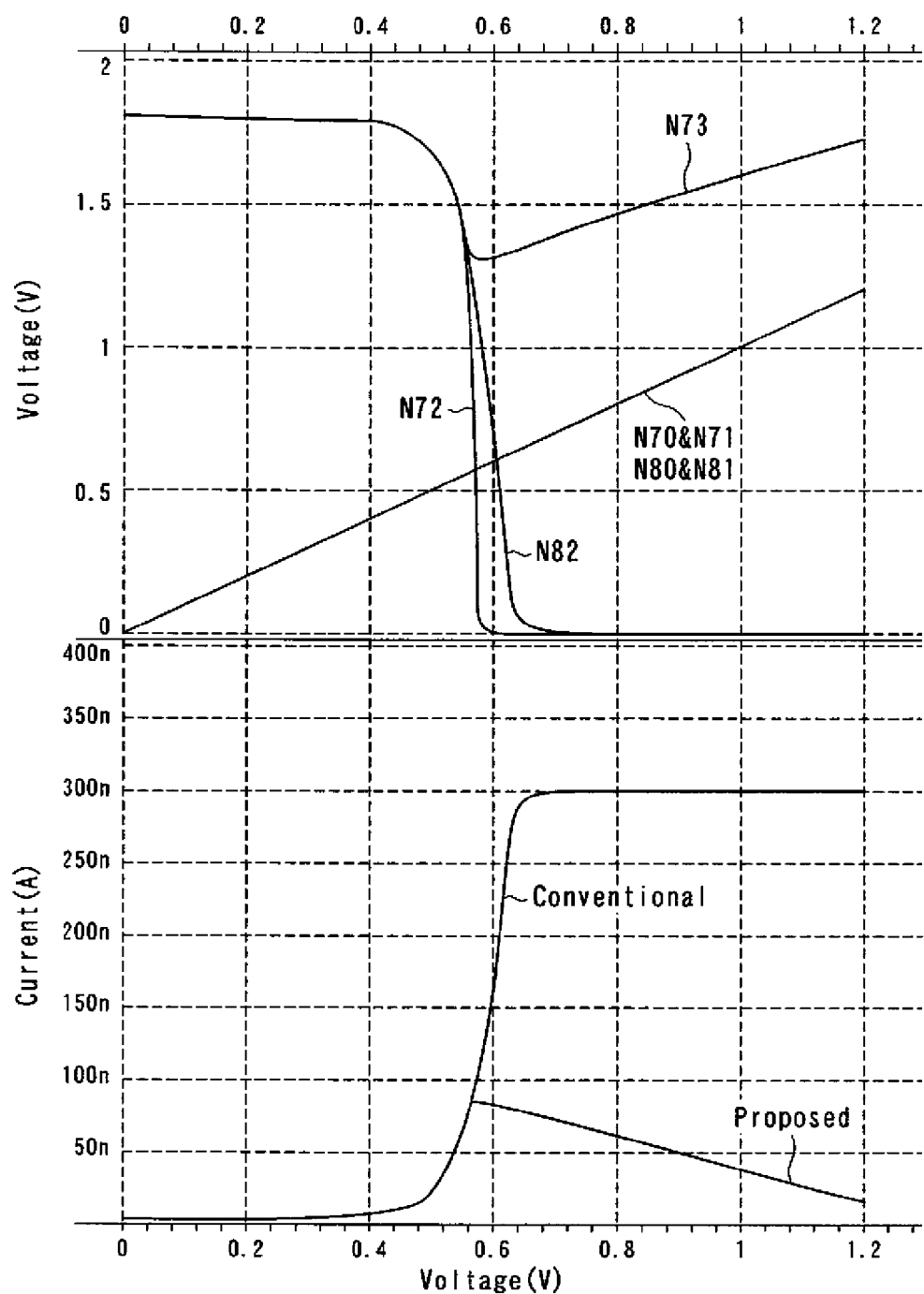
FIG. 9 is a diagram illustrating characteristics of the semiconductor device shown in FIG. 7.

FIG. 8 is a circuit diagram illustrating the level shifter LS70 having the same configuration as that of the level shifter LS60 or LS62 of FIG. 7. FIG. 17 is a circuit diagram illustrating a conventional level shifter LS80. FIG. 9 is a characteristic diagram illustrating input/output characteristics of the level shifters LS70 and LS80.

The level shifter LS70 of FIG. 8 includes a NAND circuit (or a negative AND circuit) and a resistor R70 connected in series between the power voltage VDD1 and the ground voltage VSS. The NAND circuit has input terminals connected to the nodes N70 and N71 and an output terminal connected to the node N72. The node N73 is a common node between the resistor R70 and the NAND circuit.

The nodes N70 and N71 are connected to the output terminals of the two power-on reset circuits. The power-on reset circuit is a circuit to detect variations or fluctuations in the voltage level of the power voltage (e.g., 1.2 V) which is equal to or lower than the voltage level of the power voltage VDD1. In other words, the voltage levels of the nodes N70 and N71 fluctuate between the power voltage (e.g., 1.2 V) and the ground voltage VSS (e.g., 0 V).

Figure 17:
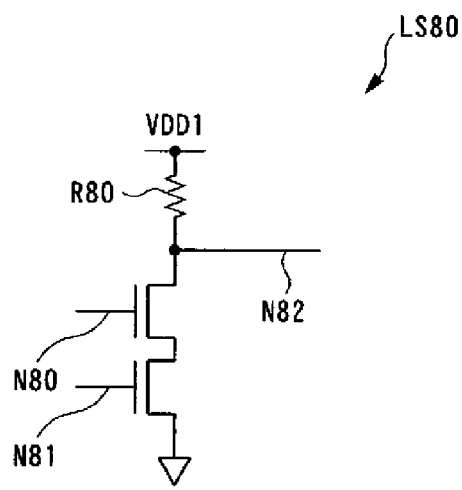
FIG. 17 is a circuit diagram illustrating a level shifter in accordance with the related art.

The level shifter LS80 of FIG. 17 includes two N-channel MOS transistors and a resistor R80 connected in series between the power voltage VDD1 and the ground voltage VSS. The two N-channel MOS transistor has input terminals connected to the nodes N80 and N81 and an output terminal connected to the node N82. The node N82 is a common node between the resistor R80 and the N-channel MOS transistor.

The nodes N80 and N81 are connected to the output terminals of two power-on reset circuits. The power-on reset circuit is a circuit to detect variations or fluctuations in the voltage level of the power voltage (e.g., 1.2 V) which is equal to or lower than the voltage level of the power voltage VDD1. In other words, the voltage levels of the nodes N80 and N81 fluctuate between the power voltage (e.g., 1.2 V) and the ground voltage VSS (e.g., 0 V).

In the characteristic diagram of FIG. 9A, the abscissa represents the input voltages of the level shifters LS80 and LS70, i.e., the voltage levels of the nodes N70, N71, N80, and N81, and the ordinate represents an input voltage level ranged from 0 V to 1.2 V, so that the voltage levels of each node of the level shifters LS70 and LS80, i.e., the voltage levels of the nodes N72, N73, and N82 are plotted. Further, the resistance value of the resistor R70 of the level shifter LS70 is set to 2 MΩ, and resistance value of the resistor R80 of the level shifter LS80 is set to 6 MΩ, where the former is set to ⅓ of the latter.

When the input voltage level is 0 V, the N-channel MOS transistors are turned off in all level shifters. Therefore, the voltage levels of the nodes N72, N73, and N82 are 1.8 V.

In the level shifter LS70, as the input voltage level is increased, the voltage between the gate and the source of the P-channel MOS transistor is decreased, and the voltage between the gate and the source of the N-channel MOS transistor is increased. As the voltages between the gate and the source of the P-channel MOS transistor and the N-channel MOS transistor approach the threshold voltages of each transistor, the voltage levels of the nodes N72 and N73 start to drop from 1.8 V.

As the input voltage level is further increased, the P-channel MOS transistor is nearly turned off, and the potential of the node N72 drops to a low level (e.g., the voltage level VOL) so that the N-channel MOS transistor is turned on. Assuming that the absolute value of the threshold voltage of the P-channel MOS transistor is denoted as Vthp, the voltage level of the node N73 drops until the difference between the input voltage level and the voltage level of the node N73 becomes the threshold voltage Vthp. Since the P-channel MOS transistor is nearly turned off thereafter, the voltage level of the node N73 is increased while maintaining the difference from the input voltage level to be as much as the threshold voltage Vthp.

In the level shifter LS80, as the input voltage level is increased, the voltage level of the node N82 drops. The drop inclination against the input voltage at the node N82 is gentle in comparison with the drop inclination at the node N72 because the resistance value of the resistor R80 is three times the resistance value of the resistor R70 of the level shifter LS70. In other words, the responding capability of the output voltage against the input voltage is superior in the level shifter LS70.

FIG. 9B illustrates the power consumption in each level shifter against the input voltage level. In the level shifter LS80, as the input voltage level is increased, the current consumption is accordingly increased. In the normal state where the input voltage becomes 1.2 V, a shoot-through current of about 300 nA continuously flows. The shoot-through current of the level shifter LS70 becomes the maximum in a switching operation of the NAND circuit. In the normal state where the input voltage becomes 1.2 V, only the shoot-through current of about 15 nA flows. In other words, the shoot-through current of the level shifter LS70 is reduced to as little as 5% of that of the level shifter LS80.

While the characteristics of the level shifter LS70 will be apparent from the above descriptions, circuit operations of the semiconductor device 200 of FIG. 7 will now be described with reference to FIG. 7.

The semiconductor device 200 performs the following operations when the power voltage starts to be supplied.

When the voltage level of the power voltage VDD1 exceeds the power-on determination voltage (e.g., 1.2 V), the power-on reset circuit POR60 transitions the voltage level of the output node N60 from 1.8 V to 0 V. The inverter circuit I12 connected to the node N60 and the inverter circuit I12a of the next stage transition the power-on reset signal PONE from 1.8 V to 0 V. As the power-on reset signal PONE is transitioned (deactivated) to 0 V, if there is no circuit in the VDD1 operation circuit block operated by receiving the power voltage VDD2, VDDCA, VPERI, or VPERI1 in the front stage, then the initialization is terminated.

If both the power voltages VDD2 and VDDA exceed the power-on determination voltages of each power-on reset circuit, the level shifter LS60 discharges the voltage level of the node N63 up to the voltage level VOL. Since the level shifter has a NAND circuit, the voltage level VOL is close to 0 V. Since the voltage level VOL is lower than the threshold voltage Vthn of the N-channel MOS transistor included in the inverter circuit I10 of the next stage, the inverter circuit I10 sets the output voltage level to the voltage level of the power voltage VDD1. The inverter circuit I10a of the next stage transitions the voltage level of the node N65 to 0 V.

The NOR circuit NOR11 having input terminals connected to the nodes N60 and N65 and the inverter circuit I11 of the next stage will transition the voltage level of the power-on reset signal PONE2 from 1.8 V to 0 V. As the power-on reset signal PONE2 is transitioned (deactivated) to 0 V, if there is no circuit in the VDD1 operation circuit block, the VDD2 operation circuit block, and the VDDCA operation circuit block operated by receiving the power voltage VPERI or VPERI1 in the front stage, the initialization is terminated.

When both the power voltages VPERI and VPERI1 exceed the power-on determination voltages of each power-on reset circuit, the level shifter LS61 discharges the output voltage level up to the voltage level VOL. The inverter circuit I13 sets the output voltage level to the voltage level of the power voltage VDD1. The inverter circuit I13a of the next stage transitions the voltage level of the node N68 to 0 V.

The NOR circuit NOR12 having input terminals connected to the output terminal of the inverter circuit I11 and the node N68 and the inverter circuit I14 of the next stage will transition the voltage level of the power-on reset signal PONV from 1.8 V to 0 V. As the power-on reset signal PONV is transitioned (deactivated) to 0 V, the initialization is terminated for a part of the VDD1 operation circuit block, the VDD2 operation circuit block, and the VDDCA operation circuit block connected to the VPERI operation circuit block and the VPERI1 operation circuit block in the front stage, the VPERI operation circuit block, and the VPERI1 operation circuit block.

If the voltage levels of the power voltages shown in the drawing exceed the power-on determination voltages of each power-on reset circuit when the power voltages start to be supplied, then the semiconductor device 200 of FIG. 7 sequentially transitions the power-on reset signals PONE, PONE2, and PONV to 0 V and terminates the initial activation state for the VDD1 operation circuit block receiving these signals to prepare a desired operation.

In FIG. 7, an operation of outputting the power-on reset signal PONE2 due to instantaneous interruption of the power voltage VDD2 will be described. When the voltage level of the power voltage VDD2 is lower than the power-on determination voltage (e.g., 0.7 V), the power-on reset circuit POR61 sets the voltage of the node N61 corresponding to the output to 0 V. As a result, the level shifter LS60 charges the node N63 up to a voltage level equal to or higher than the switching voltage level VSP of the inverter circuit I11 of the next stage using the resistor R60 and the P-channel transistor of the NAND circuit.

Accordingly, the inverter circuit I10 of the next stage transitions the output voltage level to 0 V, and further, the inverter circuit I10a of the next stage transitions the voltage level of the node N65 to the level of the power voltage VDD1. As a result, the NOR circuit NOR11 and the inverter circuit I11 of the next stage transition the voltage level of the power-on reset signal PONE2 from 0 V to 1.8 V. The NOR circuit NOR12 and the inverter circuit I14 of the next stage transition the voltage level of the power-on reset signal PONV from 0 V to 1.8 V. Additionally, the circuit blocks receiving the power-on reset signals PONE2 and PONV are initialized.

The voltage level of the power voltage VDD2 is returned to 1.2 V, and the semiconductor device 200 transitions the power-on reset signals PONE2 and PONV to 0 V as described above when the power voltage starts to be supplied. As a result, the initialization is terminated for the circuit block receiving the power-on reset signals PONE2 and PONV.

As described above, according to this embodiment of the invention, the semiconductor device (the semiconductor device 200) receives the first power voltage VDD1 and the second power voltage VDD2 which is lower than the first power voltage VDD1 and higher than the ground voltage from an external device. The semiconductor device (the semiconductor device 200) includes first and second power voltage detection circuits (the power-on reset circuits POR60 and POR61) provided for first and second power voltages, respectively. The semiconductor device (the semiconductor device 200) also includes a voltage converter circuit (the level shifter LS60) which converts the amplitude of the output signal of the second power voltage detection circuit (the power on reset circuit POR61) to the first power voltage. The voltage converter circuit includes a voltage drop element (the resistor R60) having one end connected to a first power line through which the first power voltage is supplied. The voltage converter circuit also includes a first transistor having a main electrode connected to the other end of the voltage drop device and a control terminal connected to the output terminal of the second power voltage detection circuit. The voltage drop (VR40) in the voltage drop element is nearly the same as a value obtained by subtracting the absolute value of the threshold voltage (Vthp) of the first transistor from the difference between the first and second power voltages.

The semiconductor device (the semiconductor device 200) includes a third power voltage detection circuit (the power-on reset circuit POR62) provided for a third power voltage (VDDCA) which is supplied from an external device and is lower than the first power voltage and higher than the second power voltage. The semiconductor device (the semiconductor device 200) also includes the voltage converter circuit (the level shifter LS60) that includes a third transistor having a main electrode connected to the other end of a voltage drop element (the resistor R60) and a control terminal connected to an output terminal of the third power voltage detection circuit.

As a result, the aforementioned advantages described in the first embodiment can be obtained.

Figure 10:
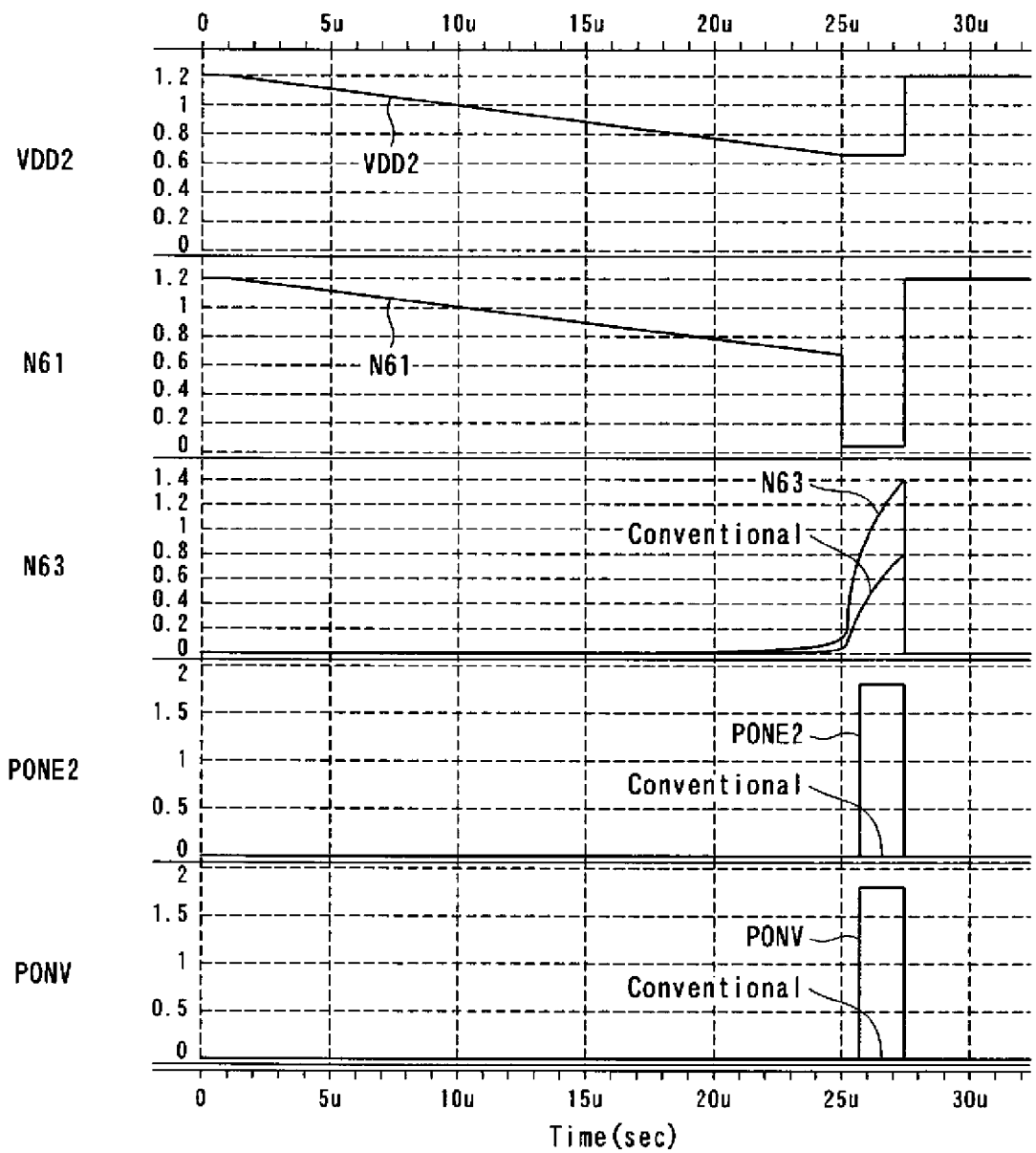
FIG. 10 is a diagram illustrating characteristics of the semiconductor device shown in FIG. 7.
Figure 11:
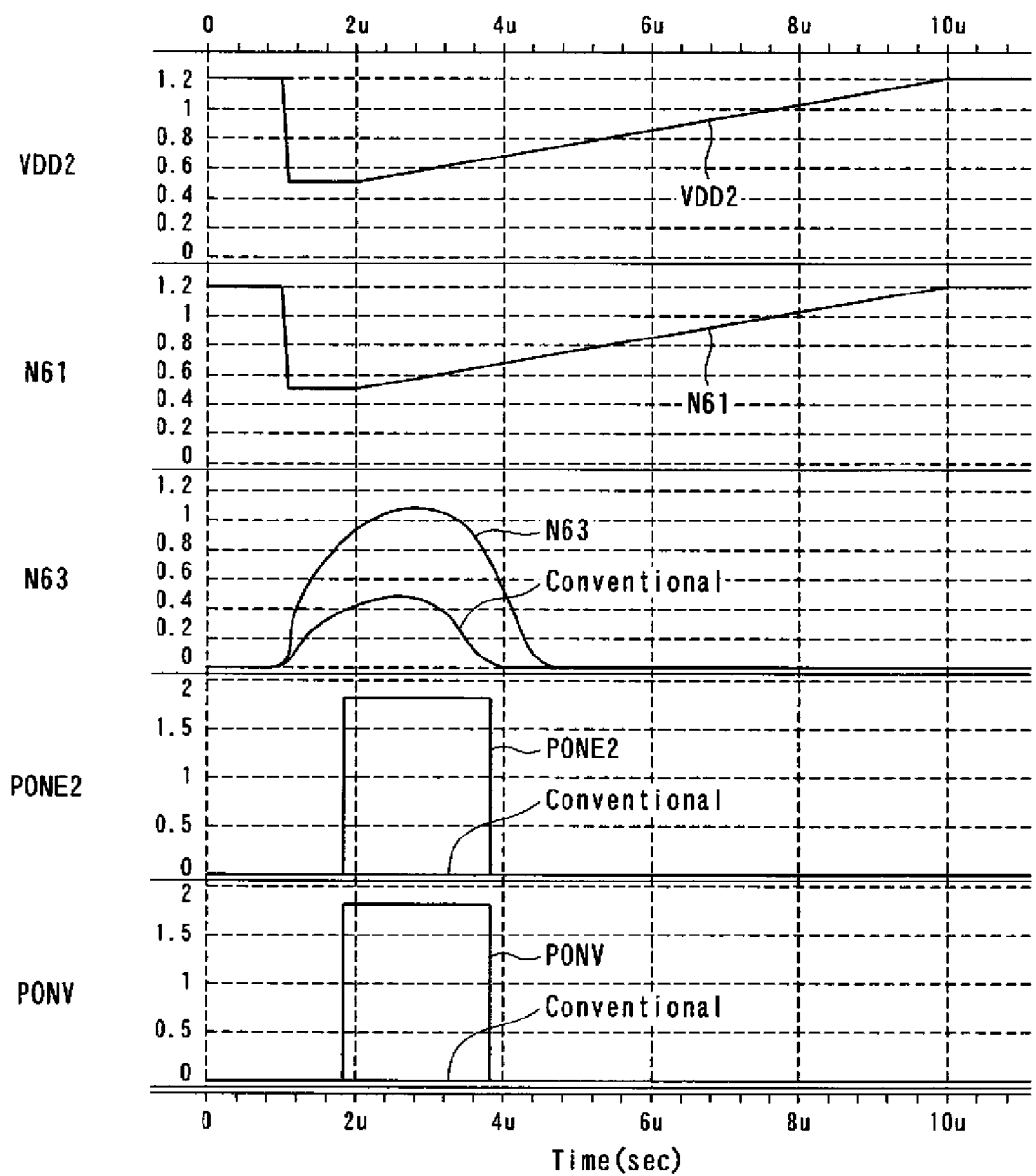
FIG. 11 is a diagram illustrating characteristics of the semiconductor device shown in FIG. 7.
Figure 12:
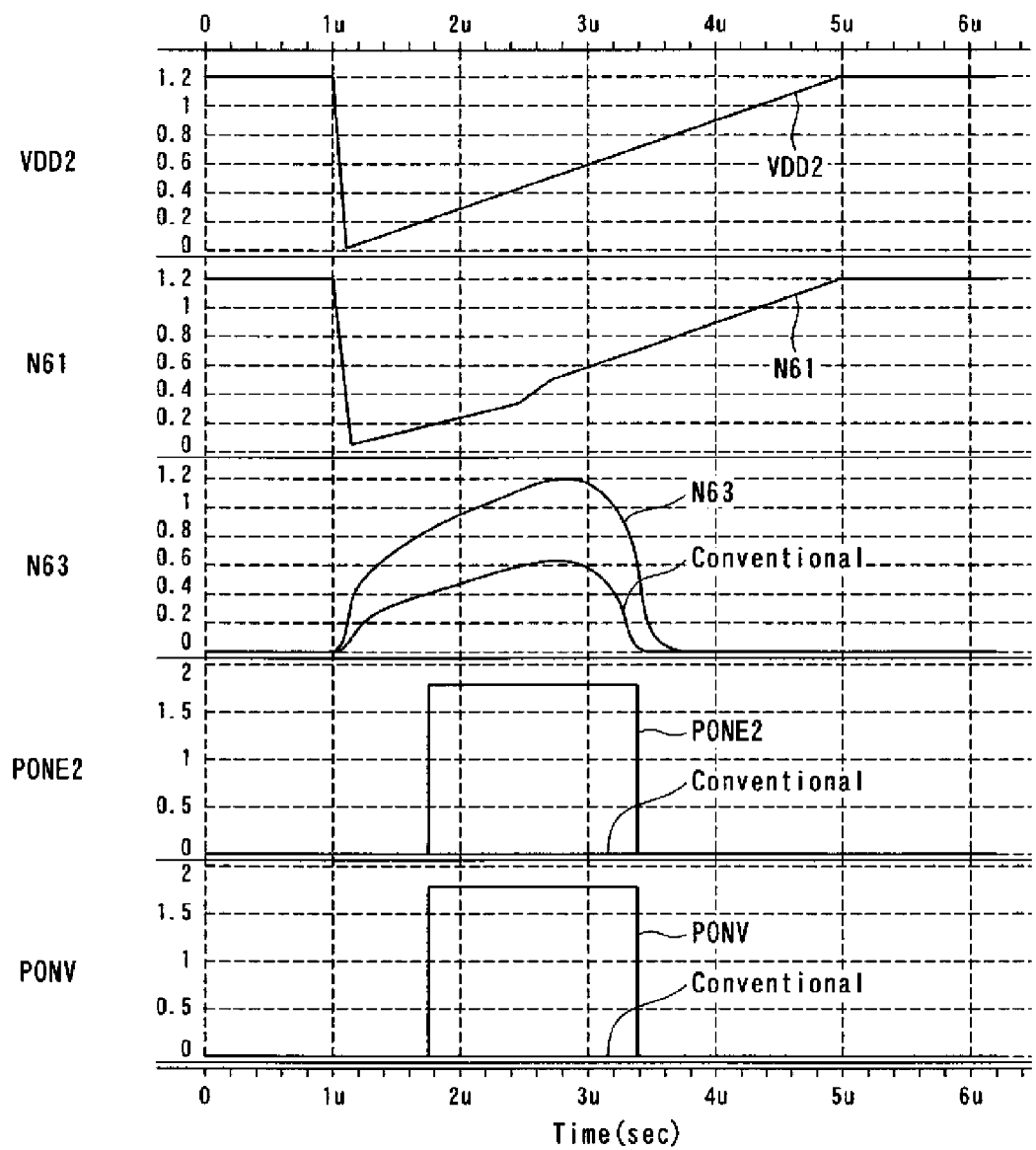
FIG. 12 is a diagram illustrating characteristics of the semiconductor device shown in FIG. 7.

FIGS. 10 to 12 are diagrams illustrating simulation results when the power voltage VDD2 is suddenly discontinued to be supplied in the semiconductor device 200. In each diagram, the abscissa represents a time, and the ordinate represents a voltage, so that voltage levels of each node are plotted. In each diagram, in order to recognize the advantages of the semiconductor device 200, waveforms obtained by using the conventional level shifter LS80 are denoted as "Conventional."

FIG. 10 illustrates simulation results when the power voltage VDD2 smoothly drops and is returned abruptly, i.e., when the power voltage VDD2 drops from the 1.2 V to approximately 0.6 V within 25 μs and is recovered to 1.2 V after 2.5 μs. While the node N63 (the output of the level shifter) is charged only up to 0.8 V in a conventional semiconductor device, the node N63 is charged up to 1.4 V according to this embodiment of the present invention. While the power voltage VDD2 is returned to 1.2 V at approximately 2.5 μs, the power-on reset signals PONE2 and PONV are not output in a conventional semiconductor device. However, according to the present embodiment, the power-on reset signals PONE2 and PONV are output, and their voltage levels are maintained at 1.8 V for approximately 2 μs.

FIG. 11 illustrates simulation results when the power voltage VDD2 abruptly drops and is smoothly recovered, i.e., when the power voltage VDD2 drops from 1.2 V to approximately 0.5 V within approximately 0.2 μs, and that voltage level is maintained for 0.4 μs and then recovered to 1.2 V at 8 μs. While the node N63 (the output of the level shifter) is charged up to approximately 0.5 V in a conventional semiconductor device, the node N63 is charged up to 1.1 V. While the power-on reset signals PONE2 and PONV are not output in the semiconductor device in the related art, they are output, and their voltage levels are maintained at 1.8 V for approximately 2 μs according to this embodiment of the present invention.

FIG. 12 illustrates simulation results when the power voltage VDD2 more abruptly drops and is rapidly recovered in comparison with FIG. 11, i.e., when the power voltage VDD2 drops from 1.2 V to approximately 0 V within approximately 0.1 μs, and that voltage level is recovered to 1.2 V at approximately 5 μs thereafter. While the node N63 (the output of the level shifter) is charged up to approximately 0.6 V in a conventional semiconductor device, the node N63 is charged up to 1.2 V according to this embodiment of the present invention. Additionally, while the power-on reset signals PONE2 and PONV are not output in a conventional semiconductor device, they are output, and their voltage levels are maintained at 1.8 V for approximately 1.6 μs according to this embodiment of the present invention.

In comparison with a conventional semiconductor device, the semiconductor device 200 according to this embodiment of the present invention is capable of outputting the power-on reset signals PONE2 and PONV even when a time for the instantaneous interruption of the power voltage is short.

Since the semiconductor device 200 includes a level shifter using a NAND circuit, it is possible to input the output signals of the power-on reset circuit to detect variations or fluctuations in the voltage level of the power voltage via a plurality of lines. Even when the voltage levels of the power voltages to be detected are increased, it is possible to suppress the number of level shifters and prevent the current consumption from being increased when the power voltage is stabilized. While the level shifter is configured using a two input NAND circuit according to the embodiments of the invention, the NAND circuit is not limited to the two input NAND circuit, but three or more input NAND circuits may be employed.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A device comprising:
   first, second, third, and fourth power lines supplied respectively with first, second, third, and fourth power supply potentials, the first power supply potential being higher than the second, third, and fourth power supply potentials, the third and fourth power supply potentials being higher than the second power supply potential;
   a first circuit coupled between the second power line and the third power line and operating on a voltage between the second power supply potential and the third power supply potential, the first circuit generating a first signal;
   a second circuit coupled between the second power line and the fourth power line and operating on a voltage between the second power supply potential and the fourth power supply potential, the second circuit generating a second signal;
   a first node;
   a resistor coupled to the first power line at one end thereof;
   a first transistor coupled between the first node and the other end of the resistor and receiving the first signal;
   a second transistor coupled between the first node and the second power line and receiving the first signal;
   a third transistor coupled between the other end of the resistor and the first node in parallel with the first transistor and receiving the second signal; and
   a fourth transistor coupled between the first node and the second power line in series with the second transistor and receiving the second signal.

2. The device according to claim 1, wherein the resistor causes a voltage drop between the one and the other ends thereof, the voltage drop is substantially equal to a first value which is obtained by subtracting an absolute value of a threshold voltage of the first transistor from a voltage between the first power supply potential and the third power supply potential.

3. The device according to claim 1, further comprising:
   a third circuit operating on the voltage between the first power supply potential and the second power supply potential and generating a third signal, and
   a fourth circuit receiving the second signal supplied from the second circuit and the third signal from the third circuit, the fourth circuit operating on the voltage between the first power supply potential and the second power supply potential.

4. The device according to claim 3, wherein the fourth circuit generates a fourth signal and activates the fourth signal when at least one of the second and third signals is activated.

5. The device according to claim 1, wherein the second transistor is different in conductivity type from the first transistor.

6. The device according to claim 1, wherein the second circuit comprises the first node, the resistor, the first transistor and the second transistor, wherein the first transistor comprises a first electrode coupled to a terminal of a voltage drop circuit and a control electrode electrically coupled to the first circuit, and wherein when the second signal takes an inactivate level, a voltage between the first electrode of the first transistor and the first control electrode of the first transistor is substantially equal to an absolute value of a threshold voltage of the first transistor.

7. A device comprising:
   first and second power supply lines; and
   a level shift circuit coupled between the first and second power supply lines, the level shift circuit (a) receiving, at an input node thereof, a first signal that has a first amplitude range, (b) transforming the first amplitude range of the first signal into a second magnitude range that is greater than the first amplitude range, and (c) outputting a transformed first signal from an output node thereof, the level shift circuit comprising,
   a resistor coupled to the first power supply line at one end thereof,
   a first transistor including a first main electrode coupled to the other end of the resistor, a second main electrode coupled to the output node of the level shift circuit, and a first control electrode coupled to the input node of the level shift circuit, and
   a second transistor including a third main electrode coupled to the output node of the level shift circuit, a fourth main electrode coupled to the second power supply line, and a second control electrode coupled to the input node of the level shift circuit.

8. The device as claimed in claim 7, wherein the first amplitude range is from a first voltage level to a second voltage level, the second amplitude range is from a third voltage level to the second voltage level, and wherein the third voltage level is higher than both the first and second voltage levels and the first voltage level is higher than the second voltage level.

9. The device as claimed in claim 8, wherein, when the first signal takes the first voltage level, the level shift circuit converts a voltage level of the first signal from the first voltage level to the second voltage level to generate the transformed first signal and, when the first signal takes the second voltage level, the level shift circuit converts the voltage level of the first signal from the second voltage level to the third voltage level to generate the transformed first signal.

10. The device as claimed in claim 8, wherein the resistor causes a voltage drop between the first power supply line and the first main electrode of the first transistor when the first signal takes the first voltage level, and wherein the voltage drop is substantially equal to a value obtained by subtracting an absolute value of a threshold voltage of the first transistor from a voltage difference between the first voltage level and the third voltage level.

11. The device as claimed in claim 7, further comprising,
    a third power supply line, and
    a first circuit coupled between the second and third power supply lines and generating the first signal,
    wherein the first, second, and third power supply lines are supplied respectively with first, second, and third power supply voltages, the first power supply voltage is higher in voltage level than both of the second and third power supply voltages, the third power supply voltage is higher in voltage level than the second power supply voltage, the first signal changes between the third and second power supply voltages, and the transformed first signal changes between the first and second power supply voltages.

12. The device as claimed in claim 11, wherein the resistor causes a voltage drop between the first power supply line and the first main electrode of the first transistor when the first signal takes the voltage level of the first power supply voltage, and wherein the voltage drop is substantially equal to a value obtained by subtracting an absolute value of a threshold voltage of the first transistor from a voltage difference between the first power supply voltage and the third power supply voltage.

13. The device as claimed in claim 7, wherein the first transistor has a different channel type than the second transistor.

14. The device as claimed in claim 7, wherein the fourth main electrode of the second transistor is coupled to the second power supply line without a resistor therebetween.

15. The device as claimed in claim 7, further comprising a third power supply line,
   wherein the first, second, and third power supply lines are supplied respectively with first, second, and third power supply voltages, the first power supply voltage is higher in voltage level than both of the second and third power supply voltages, the third power supply voltage is higher in voltage level than the second power supply voltage, the first signal changes between the third and second power supply voltages, and the transformed first signal changes between the first and second power supply voltages, and
   wherein the device further comprises,
   a first reset signal generating circuit generating a first reset signal during a first period of time when the first power supply voltage at the first power supply line is unstable, and terminating generating the first reset signal when the first power supply voltage at the first power supply line is stable,
   a second reset signal generating circuit generating the first signal during a second period of time when the third power supply voltage at the third power supply line is unstable, and terminating generating the first signal when the third power supply voltage at the third power supply line is stable,
   a first logic circuit receiving the first reset signal and the transformed first signal and performing a logic operation on the first reset signal and the first transformed signal to generate a second reset signal,
   the first reset signal generating circuit being in a reset state during a third period of time when the second reset signal is supplied thereto, and operating on the third and second power supply voltages to output a second signal after terminating being supplied with the second reset signal,
   the second reset signal generating circuit being in a reset state during the third period of time and operating on the first and second power supply voltages in response to the second signal after terminating being supplied with the second reset signal.

16. The device as claimed in claim 15, further comprising,
   a third power supply line, and
   a circuit coupled between the second and third power supply lines and including an output node coupled in common to control electrodes of the first and second transistors,
   wherein the first, second, and third power supply lines are supplied respectively with first, second, and third power supply voltages, the first power supply voltage is higher in voltage level than both of the second and third power supply voltages, and the third power supply voltage is higher in voltage level than the second power supply voltage.

17. A device comprising:
   first and second power supply lines; and
   a level shift circuit comprising,
   a resistor coupled to the first power supply line at one end thereof,
   a first transistor of a first channel type and including a first main electrode coupled to the other end of the resistor, and a second main electrode, and
   a second transistor of a second channel type different from the first channel type and including a third main electrode coupled to the second main electrode of the first transistor, and a fourth main electrode coupled directly to the second power supply line.

18. The device as claimed in claim 17, wherein the first circuit supplies the control electrodes of the first and second transistors with a first signal that changes between the third and second power supply voltages, and wherein the level shift circuit outputs a transformed first signal that changes between the first and second power supply voltages, the transformed first signal being output from a node at which the second main electrode of the first transistor and the third main electrode of the second transistor are in contact with each other.

* * * * *